United States Patent
Arai et al.

(10) Patent No.: US 6,410,960 B1
(45) Date of Patent: *Jun. 25, 2002

(54) HYBRID INTEGRATED CIRCUIT COMPONENT

(75) Inventors: Michio Arai, Tokyo; Yukio Yamauchi, Kanagawa; Naoya Sakamoto, Kanagawa; Katsuto Nagano, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/226,215

(22) Filed: Jan. 7, 1999

Related U.S. Application Data

(62) Division of application No. 08/812,453, filed on Mar. 6, 1997, now Pat. No. 5,877,533, which is a division of application No. 08/242,813, filed on May 16, 1994, now Pat. No. 5,643,804.

(30) Foreign Application Priority Data

| May 21, 1993 | (JP) | 5-142882 |
| Jul. 30, 1993 | (JP) | 5-190112 |
| Aug. 2, 1993 | (JP) | 5-191297 |
| Aug. 2, 1993 | (JP) | 5-191298 |
| Aug. 2, 1993 | (JP) | 5-191299 |
| Aug. 2, 1993 | (JP) | 5-191300 |

(51) Int. Cl.[7] .............................................. H01C 29/00
(52) U.S. Cl. ..................... 257/347; 257/351; 257/354; 257/357
(58) Field of Search ................................ 257/296–215, 257/347–355, 737, 772

(56) References Cited

U.S. PATENT DOCUMENTS

| 4,494,996 A | 1/1985 | Ohno et al. ................. 437/21 |
| 4,639,826 A | 1/1987 | Val et al. .................... 174/52.4 |
| 4,714,981 A | 12/1987 | Gordon ....................... 174/52.4 |
| 4,734,819 A | 3/1988 | Hernandez et al. ........ 174/52.4 |
| 4,974,039 A | 11/1990 | Schindler et al. ........... 257/532 |
| 5,077,225 A | 12/1991 | Lee ............................. 437/52 |
| 5,135,883 A | 8/1992 | Bae et al. ..................... 437/60 |
| 5,236,850 A | 8/1993 | Zhang .......................... 437/21 |
| 5,353,498 A | 10/1994 | Fillion et al. ............... 437/183 |
| 5,366,910 A | * 11/1994 | Ha et al. .................... 437/238 |
| 5,499,123 A | 3/1996 | Mikoshiba |
| 5,561,307 A | * 10/1996 | Mihara et al. .............. 257/296 |
| 5,643,804 A | 7/1997 | Arai et al. .................... 437/21 |
| 5,790,377 A | * 8/1998 | Schreiber et al. ........... 257/737 |
| 5,877,533 A | * 3/1999 | Arai et al. .................... 257/59 |

FOREIGN PATENT DOCUMENTS

| JP | 61-066959 | 5/1986 |
| JP | 62-048761 | 3/1987 |
| JP | 04-167466 | 6/1992 |
| JP | 4260362 | 9/1992 |
| JP | 4260363 | 9/1992 |
| JP | 05-082736 | 4/1993 |

OTHER PUBLICATIONS

Nikkei Electronics, No. 581, pp. 82–87 (May 24, 1993).

* cited by examiner

Primary Examiner—Fetsum Abraham
(74) Attorney, Agent, or Firm—Eric J. Robinson; Nixon Peabody LLP

(57) ABSTRACT

A hybrid (composite) integrated circuit element comprises a substrate, a thin film type integrated circuit formed on a substrate through a thin film process, and a lamination type passive circuit element such as a capacitor, inductor, resitance and a combination thereof formed on the integrated circuit. During the firing of passive circuit element in a hydrogen atmosphere, the semiconductor layer which constitutes the integrated circuit is also heat annealed. Various substrates can be used as the substrate, for example, quartz, ceramic and a cheap semiconductor substrate which has not been treated with a mirror-grinding by the use of a glass layer.

28 Claims, 18 Drawing Sheets

HYBRID INTEGRATED CIRCUIT COMPONENT

This is a Divisional application of Ser. No. 08/812,453, filed Mar. 6, 1997 now U.S. Pat. No. 5,877,533; which itself is a divisional of Ser. No. 08/242,813, filed May 16, 1994, now U.S. Pat. No. 5,643,804.

BACKGROUND OF THE INVENTION

1. Field of the Invention

The present invention relates to a hybrid integrated circuit (hybrid IC) component into which a thin film integrated circuit and a passive circuit including a resistor, an inductor, a capacitor or the like are assembled. The hybrid integrated circuit is also called a composite integrated circuit. More particularly, the invention relates to a composite integrated circuit into which a thin film integrated circuit formed on a substrate and at least one of an inductor having a lamination structure of a foundation material containing an electrically insulating magnetic material and a conductor, and a capacitor having a lamination structure of a foundation material containing a dielectric material and a conductor are integrated with each other.

2. Prior Art

Up to the present, there has been known a capacitor or inductor formed by a laminating method, or a hybrid component thereof. Generally, in the hybrid component, powders of a magnetic material and a dielectric material are temporarily fired at a relatively low temperature, and then mixed with a binder thereby producing a paste. The paste is printed on a temporary support substrate in the form of a sheet in such a manner that the paste is capable of being readily separated from the substrate. Further, a coil conductor or an electrode conductor is laminated on the paste-printed substrate, and these materials are alternately laminated.

The laminated body is fired at a high temperature (for example, 800 to 900° C. or 870 to 900° C. in the case of Ni—Cu—Zn based ferrite; and 1400 to 1500° C. in the case of $TiO_2$ based or $BaTiO_3$ based ceramics), to thereby obtain a laminated applied component.

Furthermore, there has been known a composite component in which the lamination applied component of a capacitor or an inductor is used for a substrate, and a bare chip IC is provided on the ceramic substrate including the L and C circuit elements.

The schematic explanatory diagram of the composite component is shown in FIG. 2. In FIG. 2, a substrate includes two circuits of L and C. By a conventional method, a magnetic material or a dielectric material and an electrode material are alternately laminated on a temporary support substrate, to thereby form a laminated body. After the laminated body is dried, the temporary support substrate is separated from those materials. Thereafter, the laminated body is fired at a high temperature, to thereby form a substrate 200 including the circuit elements of L and C shown in FIG. 2. In the figure, an inductor portion 202 is formed on a capacitor portion 201, however, this arrangement is altered as occasion demands.

On the substrate including the L and C circuits thus organized, a bare IC chip 204 is disposed. An output terminal 205 of the IC chip 204 and an electrode 206 provided on the substrate are connected to each other through wire bonding 207 or the like. The IC chip 204 is covered with a package 208 made of plastic or ceramics, resulting in the composite component shown in FIG. 2.

In the hybrid integrated circuit component thus organized, when forming the laminated body component, the laminated body is formed on the temporary support substrate by a screen printing or the like. Then, after the laminated body is dried, the temporary support substrate must be separated from the laminated body.

Further, in addition to a connecting step of electrically connecting the substrate of the laminated chip to the IC chip and the like, complicated steps such as a step of packaging the whole device and the like are required.

Still further, because the laminated components such as a capacitor, an inductor, etc. and the IC chip are manufactured based on the different specifications respectively, the combination of these components has its shape lowered in matching property, and the thickness of the combination is increased, resulting in impossibility of sufficiently mounting the components to high density.

As is apparent from FIG. 2, in the conventional hybrid integrated circuit, a single thin film integrated circuit chip is directly mounted on a single laminated body, and the thin film integrated circuit chip and the single laminated body are properly connected to each other on the substrate in accordance with a circuit design to thereby constitute a desired component. Since the passive element component of the laminated type such as a capacitor, an inductor or the like is of a thick film laminated body, it can be more sufficiently designed in characteristics for the respective functions. However, the thin film integrated circuit chip cannot provide more than a single function to the circuit formed on the semiconductor substrate. For that reason, a single hybrid integrated circuit component was formed as a component having a single function.

A conventional hybrid integrated circuit component shown in FIG. 7 is constituted in such a manner that a bare thin film integrated circuit chip 701 is mounted on a laminated body 706 mainly consisting of a laminated capacitor 703, a laminated inductor 704, and a resistor 705, and both are electrically connected to each other through wire bonding with a metallic wire 707, and the whole components are molded with a resin 708.

The thin film integrated circuit chip 701 used in FIG. 7 is constituted in such a manner that an integrated circuit such as a thin film transistor and the like is formed through the semiconductor process with an active silicon layer which is formed on a substrate such as, quartz or the like.

There has been already proposed a hybrid integrated circuit component in which the laminated body of a passive element such as a laminated type conductor or the like and a substrate having a thin film transistor and the like adhere to each other with a metallic bump so as to be electrically connected to each other (for example, Japanese Patent Unexamined Publication No. Hei 4-260363).

However, the conventional hybrid integrated circuit component has such a problem that, because the thin film integrated circuit chip is expensive although the integrated body constituting the passive element portion is formed at a very low price, the entire hybrid integrated circuit component is very expensive.

Furthermore, since the electrically connection of the laminated body and the bare thin film integrated circuit chip is performed through wire bonding, the metallic wire is liable to twist and separate, whereby the productivity is lowered and reliability is lacked.

Still further, even though the laminated body and the integrated circuit substrate are connected to each other with the metallic bump or the like, the substrate constituting the integrated circuit is made of glass or the like, as the result of which the sufficient element characteristics can not be always obtained.

There is a case where a ceramic substrate available inexpensively is used as the substrate constituting the thin film integrated circuit for the composite integrated circuit component with the above-mentioned structure. However, since the ceramic substrate has a rough surface, if a semiconductor layer for formation of the thin film integrated circuit elements is directly formed on the substrate, the rough surface of the ceramic substrate adversely affects the surface of the semiconductor layer, resulting in such a problem that, for example, the channel length of the semiconductor element is changed with the loss of the circuit element characteristics.

Further, there has been proposed an experiment to not form the thin film integrated circuit chip and the laminated body consisting of the passive element by different processes, and to built a large-capacitance capacitor within a Si substrate of an LSI by the thin film forming process to form the integrated circuit component (Nikkei Electronics, May 24, 1993, pp. 82 to 87). In this case, the capacitance of the capacity assembled in the Si substrate is limited to thereby insufficiently perform the function. Also, in the conventional composite integrated circuit component, the laminated body forming its passive element portion is formed by the thick film forming process through firing. Therefore, even in the case of laminating the dielectric material layer or the magnetic material layer into a multi-layer structure, the laminated body per se is very high in productivity and low in manufacturing costs. If the number of the inductors or the capacitors is reduced, the composite integrated circuit component is made small in size.

In the case of mounting a thin film integrated circuit on a laminated body, the laminated body has to have a sufficient area to hold the IC on it. As a result, there arises such a problem that the size of the laminated body can not be sufficiently reduced.

In the case an LSI having a large capacitance built therein, the capacitance should be formed adjacent to an integrated circuit on one substrate. As a result, the size of the device is unavoidably increased.

SUMMARY OF THE INVENTION

An object of the present invention is to provide a composite integrated circuit component into which a thin film like integrated circuit element and a laminated capacitor, a laminated inductor or the combination of the capacitor and the inductor are integrated, and to obtain a stable composite integrated circuit component which is capable of not only reducing the number of times of heating treatments necessary for formation of the active element and the passive element, but also obtaining a stable characteristics of the active element.

Another object of the invention is to provide a hybrid integrated circuit component which effectively utilizes a laminated body having a sufficient function and is low in the costs and downsized.

Still another object of the invention is to provide a hybrid integrated circuit component with a low cost without decreasing the device characteristics and also to provide the same with high productivity and high reliability.

Still further another object of the invention is to provide a composite integrated circuit component which uses a ceramic substrate as a substrate for forming a thin film integrated circuit, and also which is good in characteristics, low in the costs and downsized.

Yet another object of the invention is to provide a compact composite integrated circuit component with a low cost in which a ceramic substrate is to be used as a substrate for a thin film integrated circuit.

Yet another object of the invention is to provide a composite integrated circuit component which is small in chip size.

To solve the above problems, a first aspect of the present invention is to provide a hybrid integrated circuit in which a thin film like integrated circuit element and at least one of a laminated inductor or a laminated capacitor are formed in a composite manner, where the laminated capacitor or the laminated inductor is formed on a substrate on which the thin film integrated circuit is disposed.

A second aspect of the invention is to provide a hybrid integrated circuit in which a thin film like integrated circuit element and at least one of a laminated inductor and a laminated capacitor are formed in a composite manner, where a foundation material such as a magnetic material, a dielectric material or the like which forms the laminated capacitor or inductor, and a substrate on which the thin film integrated circuit is provided constitute main parts of a package of the composite integrated circuit component.

A third aspect of the invention has been achieved by provision of a method of manufacturing a hybrid integrated circuit in which a thin film like integrated circuit element and at least one of a laminated inductor and a laminated capacitor are formed in a composite manner, characterized in that a semiconductor material of a thin film transistor provided in a thin film integrated circuit portion is heated simultaneously when the laminated capacitor or inductor is fired.

A fourth aspect of the invention has been achieved by provision of a method of manufacturing a hybrid integrated circuit, characterized in that, when forming a laminated body consisting of a laminated passive element portion on a substrate on which a thin film integrated circuit is formed, a reflow film is provided between a thin film integrated circuit portion and the passive element portion.

A fifth aspect of the invention is to provide a hybrid integrated circuit, characterized in that a hydrogen introducing means is disposed on a lower portion of the laminated body formed of the passive element portion which is in contact with the reflow film.

A sixth aspect of the invention is to provide a laminated body having at least one laminated passive element and a plurality of thin film integrated circuit chips with different functions in parallel with each other on one substrate.

A seventh aspect of the invention is to provide a hybrid integrated circuit component in which a laminated body of a passive element which is formed of a lamination-shaped capacitor, inductor, resistor or the combination thereof and a thin film integrated circuit are combined with each other, where a substrate for forming the active element of the thin film integrated circuit is formed of a polycrystalline or monocrystalline semiconductor substrate as used for a solar battery, and an active element component formed of the thin film integrated circuit is constituted by a semiconductor layer disposed on the substrate through an insulating film.

An eighth aspect of the invention is characterized by connecting the thin film integrated circuit chip and the laminated body simply by use of a solder bump.

Further, in order to solve the above problems, a ninth aspect of the invention has been achieved by provision of a composite integrated circuit component in which a laminated capacitor, inductor, resistor or a laminated body formed of these composite components is formed on a ceramic substrate on which a thin film integrated circuit is formed, characterized in that a layer mainly containing a silicon oxide is formed on a surface of the ceramic substrate so that the roughness of the substrate surface is smoothed, and a thin film integrated circuit element is formed on the smoothed surface of the substrate.

A tenth aspect of the invention has been achieved by provision of a composite integrated circuit component in which a laminate type passive circuit including a laminate type capacitor, laminate type inductor or the combination thereof is formed on a substrate having a thin film integrated circuit formed thereon, wherein a passivation film is formed on the thin film integrated circuit and the passive circuit is laminated thereon through a thin film process.

DETAILED DESCRIPTION OF THE PREFERRED EMBODIMENTS

Figure 1:
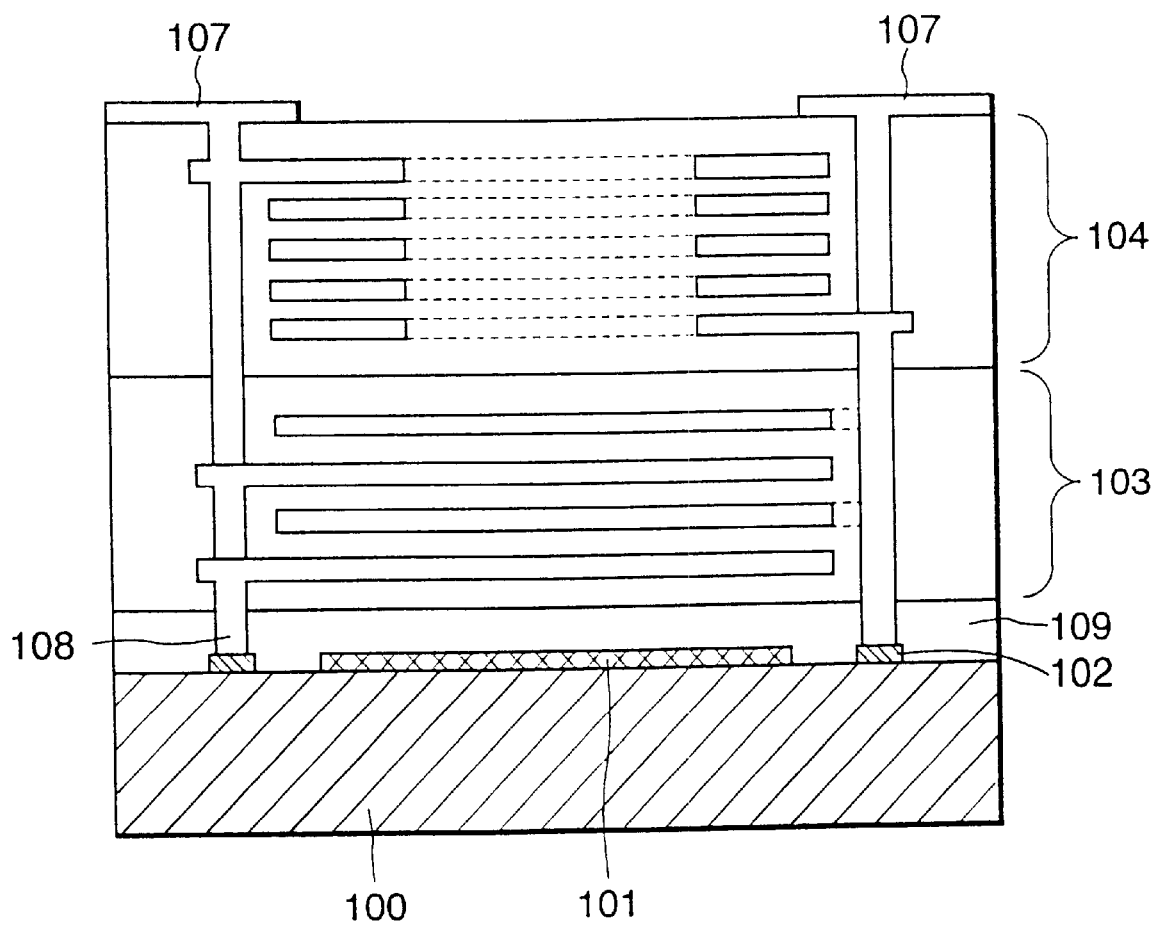
FIG. 1 is a cross-sectional view showing a composite integrated circuit component in accordance with a first embodiment of the present invention.
Figure 2:
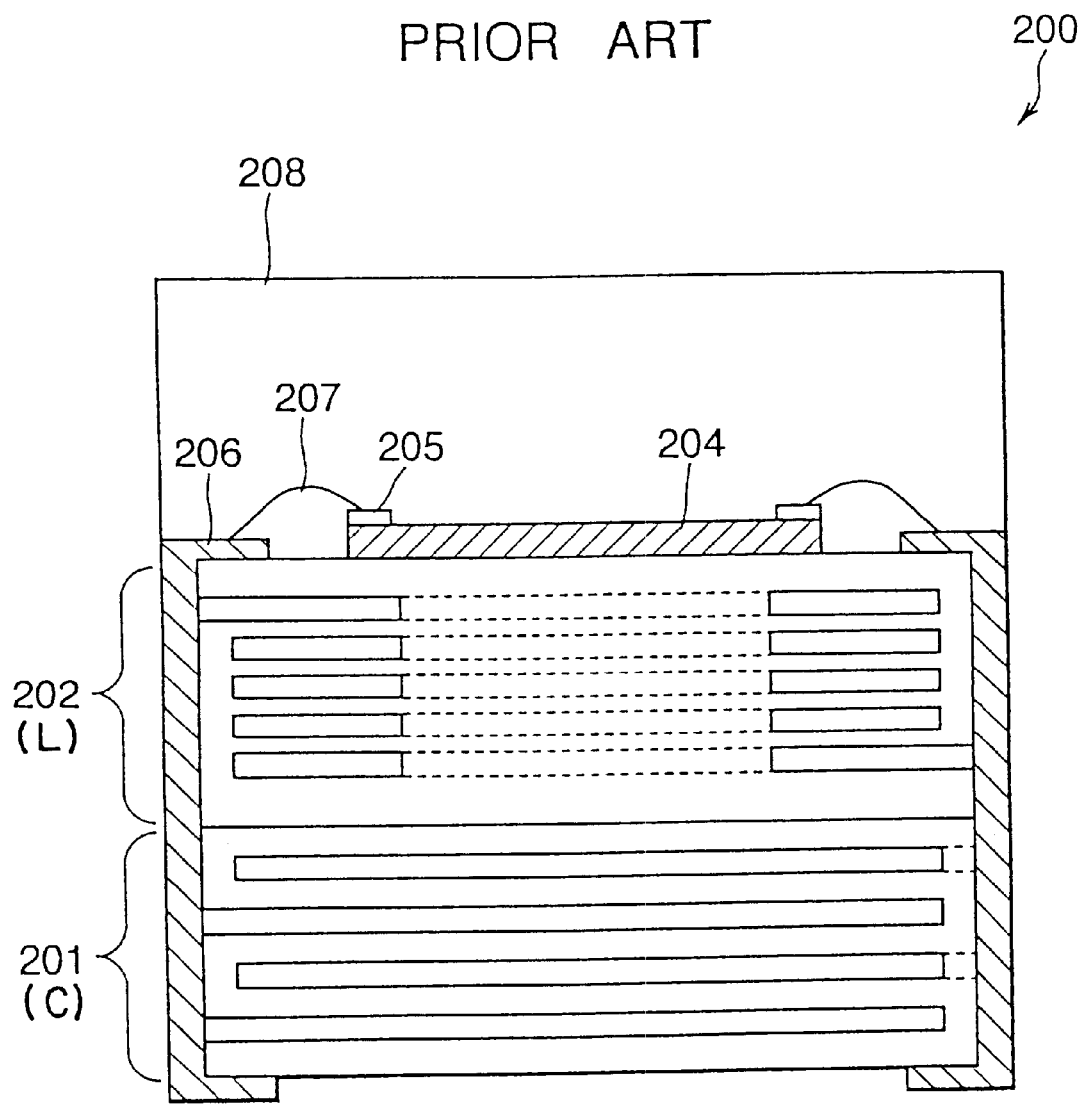
FIG. 2 is a cross-sectional view showing a conventional composite integrated circuit component.

Hereinafter, embodiments of the present invention will be described with reference to the accompanying drawings. The same reference numerals denote the identical or like components.

FIG. 1 shows a cross-sectional view showing a composite integrated circuit component in accordance with a first embodiment of the invention. In FIG. 1, a substrate 100 is formed of, for example, a high heat-resistant quartz substrate. Disposed on the substrate 100 is a thin film integrated circuit 101 having a silicon gate type TFT and utilizing a silicon material as an electric wiring. Output electrodes 102 for the thin film integrated circuit 101 are formed on the same substrate 100.

A silicon oxide coat 109 is formed as a protective film so as to cover the thin film integrated circuit 101. Through-holes are defined at a portion corresponding to the output electrodes 102.

A capacitor portion 103 and an inductor portion 104 are provided on the protective film 109 in a laminated structure. When these laminated capacitor and inductor are to be formed, a paste-like foundation material containing a magnetic material or dielectric material and an electrode material are alternately stacked to form a given pattern. In this case, when the foundation material is to be formed by the paste printing, through-holes are defined so that electrode materials 108 penetrating the through-holes are connected to the output electrodes 102 for the thin film integrated circuit 101 and finally connected to electrodes 107 of the composite integrated circuit component, respectively. The circuit component is mounted on other wiring boards through the electrode portions.

In the figure, there is shown a cross-sectional view of only a part of the component in accordance with the invention, however, there is a case where other parts are also connected with electrodes in the same manner.

Thus, the substrate 100, a dielectric material and/or a magnetic material constitutes a primary package of the composite integrated circuit component. For that reason, it is not required to provide a package made of ceramics or plastics for additional protection.

Because the composite integrated circuit component is fired at a high temperature when forming the capacitor or inductor, the substrate 100 which is a foundation of these elements and the thin film integrated circuit 101 are required to withstand the firing temperature. For that reason, it is preferable that the structural components including the thin film transistor of the thin film integrated circuit are mainly made of a silicon material. In particular, in the case of using a doped silicon for an electric wiring, the heat-resistivity and reliability are improved.

In a process of forming the thin film semiconductor, particularly, the thin film transistor, a variety of heating treatments are repeatedly performed. In particular, in the case of using a polycrystalline material or a monocrystalline material for a semiconductor layer, it is necessary to heat the semiconductor at a relatively high temperature (for example, at more than 500° C.) for a long period of time.

Furthermore, when activating impurities in source and drain regions, it is necessary to heat them at a relatively high temperature. These heat treatments can be made simultaneously at the time of forming the L and C circuits, to thereby greatly contribute to the simplicity of the process.

According to this embodiment, the circuits of L and C performing sufficient functions can be realized, and also when forming the circuit of L or C, electrodes for the exterior are formed inside of the laminated body by use of the circuit patterns, as a result of which a primary external form can be constituted by the substrate and the ceramics formed on the substrate so that a final package is not required.

An example of a process of manufacturing a composite integrated circuit component in which an inductor is provided on a thin film integrated circuit formed on a substrate in accordance with the embodiment will be described below.

First, one example of a process of manufacturing a thin film transistor which is a primary structural component among the thin film integrated circuit constituting a foundation is shown in FIGS. 3 to 5(B).

Figure 3:
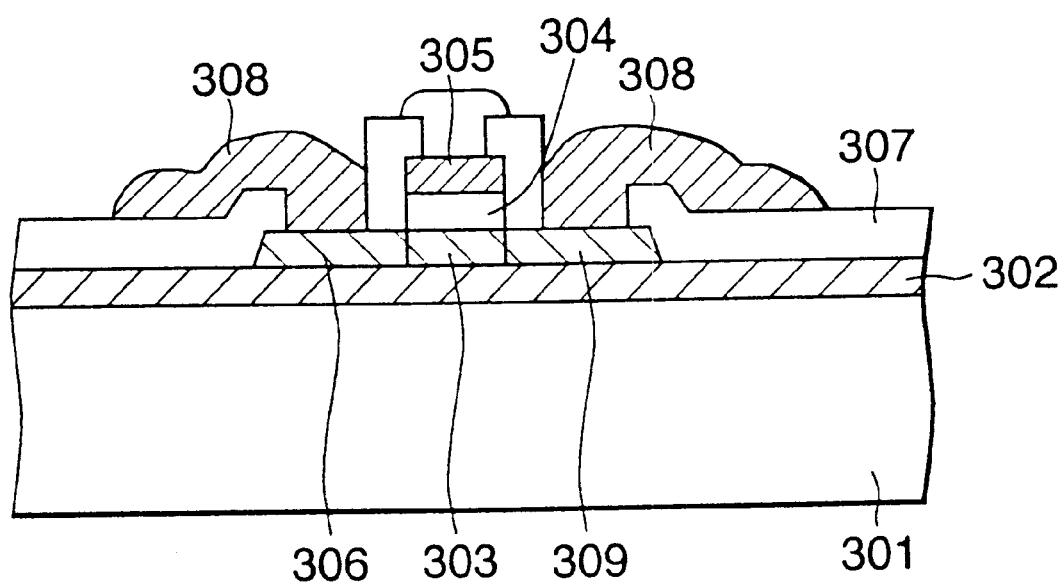
FIG. 3 is a cross-sectional view showing a thin film transistor provided in the composite integrated circuit component in accordance with the first embodiment of the invention.

FIG. 3 shows a schematic sectional view of the thin film transistor used in this embodiment. Reference numeral 301 denotes a substrate made of quartz; 302, a silicon oxide film; 303, an active layer; 304, a gate insulating film; 305, a gate electrode; 306 and 309, source and drain regions, respectively; and 308, an electrode.

Used for the substrate 301 is a high heat-resistant substrate, for example, a quartz substrate. On the substrate 301, the silicon oxide film 302 having a thickness of 3000 Å is formed by the sputtering method (refer to FIG. 4(A)).

Subsequently, on the silicon oxide film 302, a non-single crystalline silicon film 303 having a thickness of approximately 800 Å is formed by a decompression CVD method (refer to FIG. 4(B)).

The film forming conditions at this time are stated below.

Disilane gas: 100 to 500 SCCM

Helium gas: 500 SCCM

Reaction pressure: 0.1 to 1 Torr

Heat temperature: 430 to 500° C.

Then, after the non-single crystalline silicon film 303 is subjected to patterning in the form of a predetermined island, it is heated at a temperature of approximately 600° C. for approximately 40 hours, thereby changing into a polycrystalline (refer to FIG. 4(C)).

Thereafter, on the substrate having the semiconductor island thereon, a silicon oxide film 304 which forms the gate insulating film is formed by the plasma CVD method with a starting material of TEOS (tetraethoxy silane) (refer to FIG. 4(D)).

The film forming conditions of the gate insulating film are stated below.

TEOS gas: 10 to 50 SCCM

Oxygen gas: 500 SCCM

High frequency output: 50 to 300 W

Substrate temperature: 400° C.

Next, on the gate insulating film 304, a silicon layer 305 constituting a gate electrode having a thickness of approximately 2000 Å by a reduced pressure CVD method. The film forming conditions, etc. are the same as those in the above-mentioned case. When forming this film, a dopant such as phosphorus or the like can be added to the film (refer to FIG. 4(E)).

Sequentially, the gate electrode 305 and the gate insulating film 304 are formed by the etching process in accordance with a predetermined pattern, respectively (refer to FIG. 4(F)).

Thereafter, with a mask of the gate electrode 305, portions of the semiconductor island which are to constitute source and drain regions are doped with phosphorus by an ion doping method to thereby form the source and drain regions 306 and 309 in such a manner that the regions 306 and 309 are self-aligned with respect to the gate electrode (refer to FIG.

Then, the substrate including these elements is heated at 550° C. for 5 hours in the nitrogen atmosphere to activate the dopant. Furthermore, it is heated at 400° C. for 30 minutes in the hydrogen atmosphere, to thereby produce hydrogen so that the defect level density of the semiconductor layer is reduced.

Further, a silicon oxide film having a thickness of 4000 Å is formed as an inter-layer insulating film 307 on the overall substrate with a starting material of TEOS. The film forming conditions are the same as those in the above-mentioned case. For the purpose of wiring respective electrodes, a patterning process is performed in accordance with a required pattern, to thereby obtain a state shown in FIG. 5(B).

Subsequently, a second doped silicon film 308 for electrodes is formed in the same manner, whereby the thin film transistor is completed as shown in FIG. 3.

As the thin film integrated circuit, thereafter, an inter-layer insulating film 310 which also serves as a protective film is formed by, for example, a CVD method, and subsequently through-holes are formed therein for electrodes. (refer to FIG. 6(A))

In the above description, the example of the process of manufacturing the thin film transistor which is a primary structure of the thin film integrated circuit was described. In the middle of this process or in the same process, other elements necessary for the thin film integrated circuit are formed by predetermined patterns so that the thin film integrated circuit is completed.

Further, in the case where an additional wiring is required in constructing the thin film integrated circuit, another inter-layer insulating film and another doped silicon film are likewise stacked on each other thereby forming a multi-layer wiring.

Next, on the substrate on which the completed thin film integrated circuit has been formed, an inductor is formed by use of a printing method. The schematic processing diagram is shown by FIG. 6(A)–6(C).

For the used magnetic material, a Ni—Cu—Zn ferrite is used, and at least this material and an organic synthetic resin binder are mixed with each other to prepare a foundation material paste for printing. Also, naturally, it is possible to mix them with other materials in accordance with a required characteristic.

Figure 6:
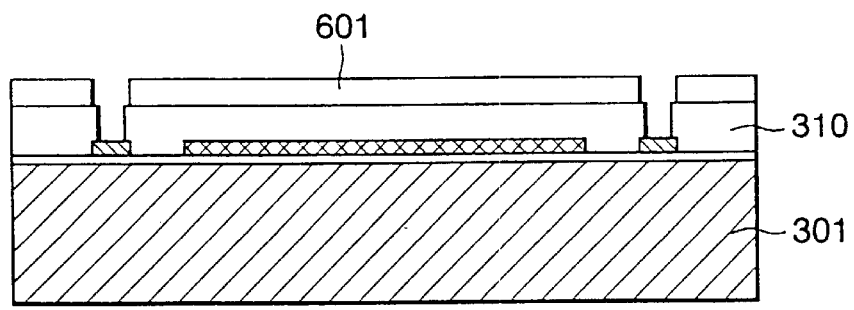
FIGS. 6(A) to 6(C) show steps of manufacturing a laminated inductor of the composite integrated circuit component in accordance with the first embodiment of the invention.
Figure 6:
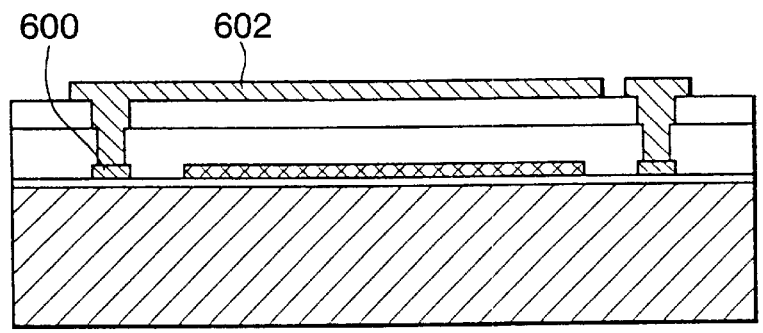
Figure 6:
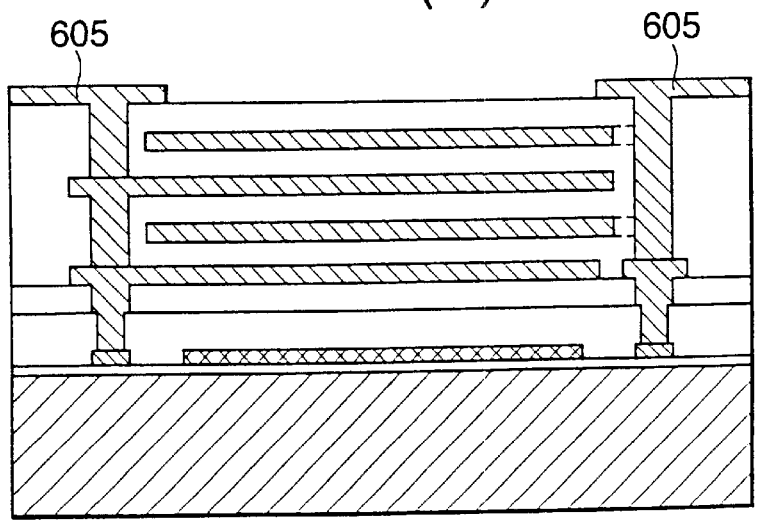
Figure 7:
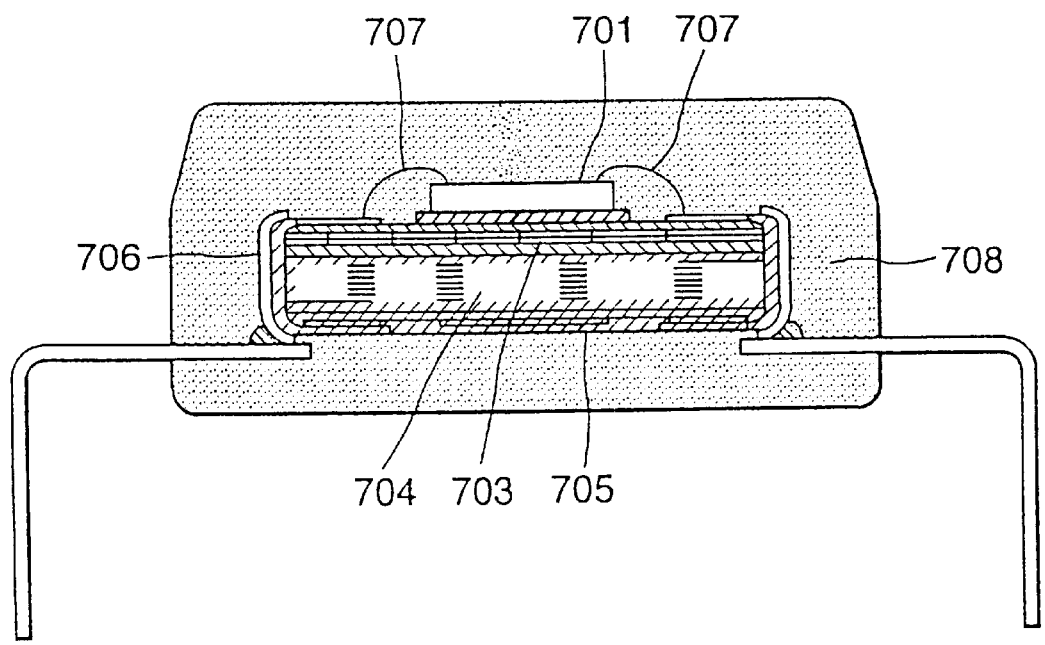
FIG. 7 is a cross-sectional view showing a conventional composite integrated circuit component.

By the printing method using this paste, a magnetic material 601 is printed with a predetermined pattern on the substrate on which the above-mentioned thin film integrated circuit has been formed (refer to FIG. 6(A)).

Thereafter, Ag—Pd powders are used for the conductor material of the inductor, and they are mixed with the synthetic resin binder to produce a print paste. The print paste constituting a conductor material 602 is printed on the magnetic material 601 which has been printed in the predetermined pattern (refer to FIG. 6(B)).

At this time, a pattern of the thin film integrated circuit is so designed that the output electrode 600 and the conductor material 602 are electrically connected to each other, and the through-holes for connection between the electrode 600 and the material 602 are formed at the time of printing the magnetic material 601.

Likewise, the foundation material layer containing the magnetic material and the conductive material layer are stacked on each other, and this laminated body is printed plural times in the same manner in accordance with a pattern designed so as to constitute the inductor. Also, at this time, using a part of the pattern, through-portions which are linked with the output electrodes of the thin film integrated circuit are formed within the inductor.

Finally, the output electrodes 605 of the composite integrated circuit component are printed with the same conductive material in such a manner that the laminated inductor is formed on the substrate, as shown in FIG. 6(C).

Next, the entire substrate including these lamination bodies is fired at a predetermined temperature, for example, 800 to 1000° C., at 850° C. in this embodiment, so that the organic binder within the laminated body is removed and the inductor is fired, thereby forming the composite integrated circuit component of this embodiment. In the embodiment, the combination of the inductor and the thin film integrated circuit was described. However, likewise, the combination of other circuit elements, for example, a resistor and a capacitor can be performed. Also, these circuit elements can be arranged not only in the longitudinal direction but also in the lateral direction. In this case, the volume of the composite integrated circuit component can be reduced, thereby attaining more downsized and at-high-density mounted device.

In the composite integrated circuit component thus formed, the primary outer portion is constituted by the substrate for thin film integration and the foundation material of the laminated inductor. The connecting portions for electrical connection to the exterior are formed within the laminated component simultaneously when forming the laminated component, and finally formed on a surface of the inductor. Consequently, no additional outer package material is particularly required.

In the above-mentioned embodiment, the laminated inductor is provided on the substrate having the thin film integrated circuit formed thereon. In other cases, a capacitor, a resistor and the like may be provided as occasion demands, or a plurality of these elements may be combined with each other to produce the composite integrated circuit component.

As the conductor material to be used, Ag, Au, Cu, Pd or an alloy thereof can be used. As the magnetic material or the dielectric material, there can be used galvanized ferrite, Mn—Zn ferrite, Ni—Cu—Zn ferrite, iron oxide ferrite, alumina, barium titanate, titanium oxide or the like.

Furthermore, as the substrate of the thin film semiconductor, there can be used a high heat-resistant substrate besides quartz, sapphire, alumina and the like.

These materials can be combined in various manner, however, it is necessary to properly select them in accordance with a required heating temperature.

As a second embodiment, a composite integrated circuit component having a structure in which TFT is provided on a polycrystalline silicon substrate, and further on the TFT, a laminated body forming a passive element is formed will be described with reference to FIG. 8.

Figure 8:
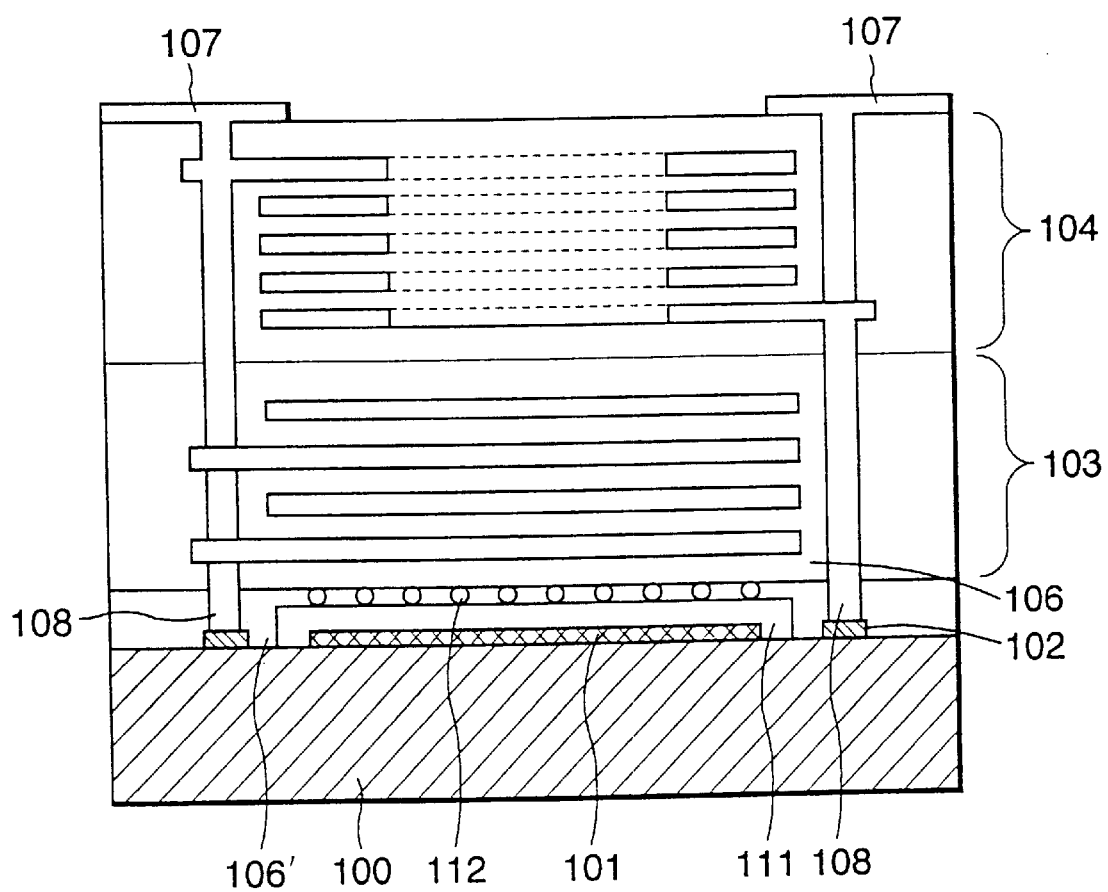
FIG. 8 is a cross-sectional view showing a composite integrated circuit in accordance with a second embodiment of the invention.
Figure 9:
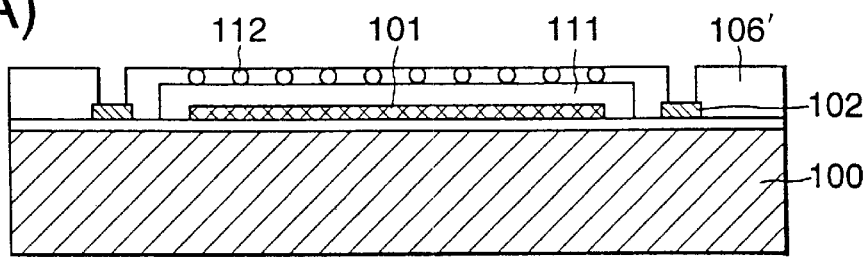
FIGS. 9(A) to 9(D) show steps of manufacturing a laminated inductor of the composite integrated circuit component in accordance with the second embodiment of the invention, respectively.
Figure 9:
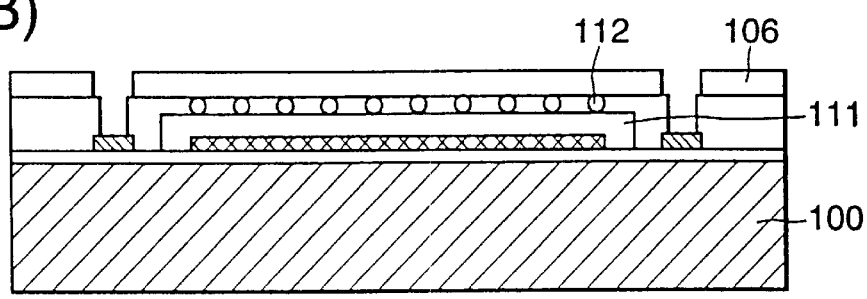
Figure 9:
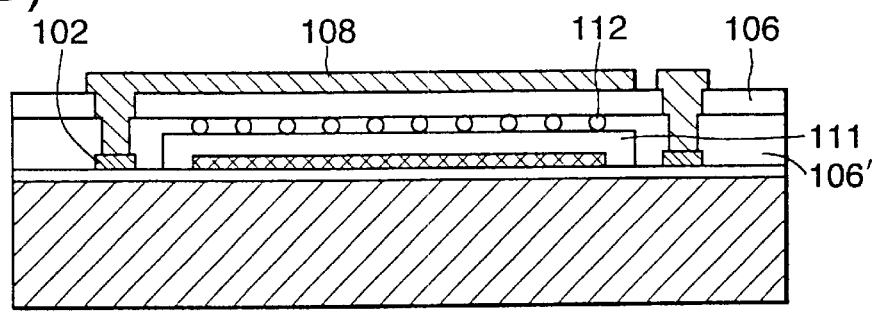
Figure 9:
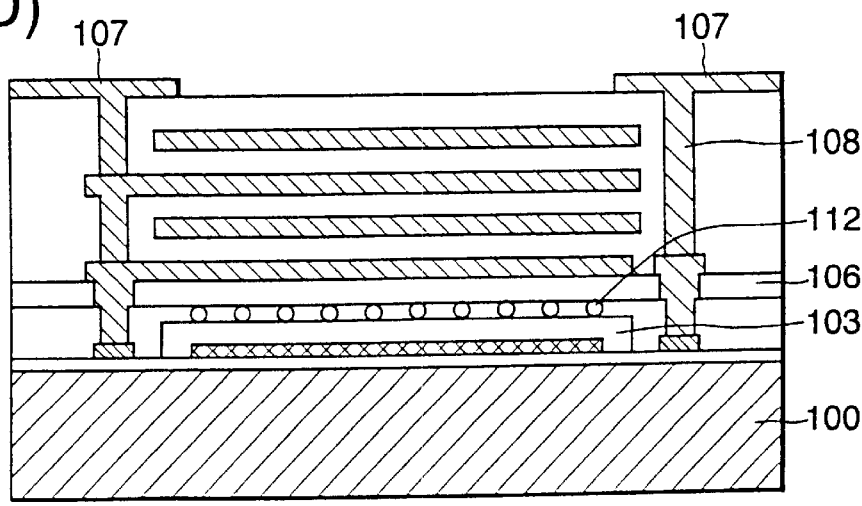

In FIG. 8, reference numeral 100 denotes a polycrystalline silicon substrate; 101, an active silicon substrate; 102, output electrodes; 111, a reflow film; 112, hydrogen introducing holes; 106, a dielectric layer; 103, a laminated capacitor portion; 104, a laminated inductor portion; and 107 and 108, electrodes.

As shown in FIG. 8, in this embodiment, the active silicon substrate 101 including a thin film integrated circuit is disposed on the polycrystalline silicon substrate 100 having an $SiO_2$ film (not shown) on a surface thereof, and the outer surface of the active silicon substrate 101 is covered with the reflow film 111 which consists of, for example, a phospho silicate glass layer (PSG).

The dielectric material layer (106, 106') is formed on the reflow film 111, and a lower dielectric layer 106' is provided with the hydrogen introducing holes 112 at least above the active silicon substrate 101.

The laminated capacitor portion 103 and the laminated inductor portion 104 are formed on the reflow film 111.

The laminated capacitor portion 103 and the laminated inductor portion 104 are formed in such a manner that a foundation material paste containing the dielectric material or magnetic material and electrode material are alternately printed and laminated to thereby form a predetermined pattern.

When each foundation material paste is to be printed into a layer, through-holes are provided to form the electrode portions 108.

A process of manufacturing a thin film transistor formed on the polycrystalline silicon substrate, which constitutes one structural element of the invention will be described with reference again to FIGS. 3 to 5(B)

A silicon oxide film 302 having a thickness of 1000 to 5000 Å is formed on a polycrystalline silicon substrate 301 by a sputtering method (refer to FIG. 4(A)).

Subsequently, on the film 302, an amorphous silicon (α-Si) layer 303 having a thickness of 500 to 6000 Å by a low pressure CVD method (refer to FIG. 4(B)). The film forming conditions are stated below.

$Si_2H_6$: 100 to 500 SCCM

He: 500 SCCM

Reaction pressure: 0.1 to 1 Torr

Film forming temperature: 430 to 500 ° C.

After the amorphous-Si layer 303 is patterned in the form of an island, it is heated at approximately 600° C. for approximately 40 hours in the nitrogen atmosphere to thereby obtain an active silicon layer (refer to FIG. 4(C)).

Further, in order to form a gate insulating film, a silicon oxide film 304 having a thickness of 500 to 2000 Å is formed by a dry oxidation (refer to FIG. 4(D)).

The forming conditions of the gate insulating film are stated below.

$O_2$: 2.5 SLM

Temperature: 850 to 1100° C.

Next, for the purpose of forming a gate electrode, a silicon layer 305 doped with P or B, having a thickness of 1000 to 4000 Å is formed by a low pressure CVD method (refer to FIG. 4(E)).

These layers are subjected to etching in accordance with a predetermined pattern to thereby form a gate insulating film 304 and a gate electrode 305 (refer to FIG. 4(F)).

Thereafter, with a mask of the gate electrode 305, portions, which are to constitute the source and drain regions, are doped with, for example, P by an ion doping method, to thereby form source and drain regions 306 and 309 (refer to FIG. 5(A)).

Sequentially, the substrate including these elements is heated at 600° C. for 12 hours in the nitrogen atmosphere to activate the dopant.

Furthermore, a PSG film 307 having a thickness of 4000 to 8000 ° is entirely formed on the substrate by the atmospheric pressure CVD method. Thereafter, the film 307 is patterned in accordance with a pattern necessary for the respective electrode wiring (refer to FIG. 5(B)).

Next, a doped silicon film for electrode and wiring is formed by a decompression CVD method, and is then patterned to form an electrode 308, whereby the TFT is completed (refer to FIG. 3). As the electrode 308, for example, a high-melting-point metal such as Mo, W or the like may be used.

Thereafter, the inter-layer insulating film, which also acts as a protective film, is formed, and the electrode through-holes are formed therein to perform wiring so that the electrodes are connected to other structural components to constitute an integrated circuit.

In the present invention, when a composite component with a lamination structure is further to be formed by the printing method on the substrate on which the completed thin film integrated circuit has been formed, the reflow film and the hydrogen introducing means are provided.

Referring to FIGS. 9A–9D, a manufacturing process in which the laminated capacitor is formed on the substrate on which the thin film integrated circuit has been formed will be described;

A large number of integrated circuits including TFTs are formed on a large-sized substrate as in the case of a large-sized substrate of the 100×100 type. And silicon alkoxide and phosphorus alkoxide are then formed thereon by a screen printing method to a thickness of 10–50 μm, following which the film is heated at about 600° C. to remove a binder material to thereby form a PSG film which constitutes the reflow film 111.

In the present invention, the laminated body consisting of the passive element with the lamination structure is formed on the active silicon substrate 101 on which the thin film integrated circuit is formed, and thereafter fired. The laminated body is reduced in volume by the degree of approximately 20% due to firing. For this reason, the volume reduction causes stress to occur in the surface between the laminated body and the active silicon substrate 101. The reflow film 111 of the invention is used for preventing the characteristics of the thin film integrated circuit from being unstable due to the stress.

After formation of the reflow film, a dielectric layer 106' which is a lower layer of the laminated body is formed by coating a paste through a screen printing. The paste is, for example, a mixture of barium titanate and an organic synthetic resin binder.

In the present invention, in the case where the paste is to be printed in a predetermined pattern by the screen printing, there is provided the hydrogen introducing holes 112 attaining to the reflow film 111 as a hydrogen introducing means in order that hydrogen sufficiently reaches the active silicon substrate 101 when hydrogenation treatment is performed; (refer to FIG. 9(A)).

The hydrogen introducing hole 112 can be formed, for example, by use of the mask pattern for the screen printing, as in the formation of through-holes corresponding to the output electrodes 102 on the substrate 100.

The reflow film is made of an oxide such as the PSG film, through which hydrogen can transmit. Therefore, they hydrogenation of the active layer can be further facilitated. In other words, it is preferable to use a permeable material to hydrogen as the reflow film. The dielectric material layer 106 is further formed on the reflow film 111 (refer to FIG. 9(B)).

Sequentially, as the conductive material of the capacitor, for example, Ag—Pd powders are prepared and mixed with a synthetic resin binder to produce a printing paste. The paste is screen-printed on the printed dielectric material layer 106 in a predetermined pattern to thereby produce a conductive material layer 108 (refer to FIG. 9(C)).

The pattern like this is designed in such a manner that a conducting portion is formed through the through-holes provided in the reflow film 111 and the dielectric material layer 106, so that the output electrodes 102 on the substrate of the thin film integrated circuit and the conductive material layer 108 are electrically connected to each other in a predetermined manner.

Likewise, the dielectric material layer and the conductive material layer are printed plural times in turn so that the laminated body constitutes a conductor having a given characteristic. At this time, a part of the pattern is used in such a manner that conducting portions connected to the output electrodes 102 for the thin film circuit are formed within the conductor.

Finally, the output electrodes 107 for the composite integrated circuit component is formed by the same material layer as the conductive material layer of the conductor. (refer to FIG. 9(D)).

Then, after the substrate on which the composite integrated circuit component is formed is cut into a respective chip size, it is subjected to annealing treatment. That is, the chips are fired at 800 to 950° C. for 0.5 to 5 hours so as to remove the organic synthetic resin binder within the laminated body, to fire the conductor, and to fire the PSG film formed as the reflow film. During this firing, the reflow film melts at least partially so that the stress caused by the difference in thermal coefficients of expansion can be reduced.

Thereafter, the chips are annealed for two hours in a hydrogen atmosphere at 450° C. to perform a hydrogenation treatment for decreasing the interface level between the active silicon layer and the gate oxide film, thereby completing the composite integrated circuit in accordance with this embodiment.

The reason why the substrate is fired after the large-sized substrate forming the respective elements is cut into the chip size is that the thick laminated body is more hardened due to the firing, resulting in difficulty of cutting the laminated body, and the influence of the contraction stress caused by firing on the laminated body is also reduced.

Furthermore, the hydrogenation treatment itself can be facilitated by first cutting the substrate into each chip and then firing it in the hydrogen atmosphere.

In this embodiment, the composite integrated circuit component combining the thin film integrated circuit, the laminated capacitor and the laminated inductor together was described, however, the present invention is not limited to this combination. That is, the composite integrated circuit component including the thin film integrated circuit and another circuit element, for example, the laminated capacitor, inductor, resistant element or the combination thereof is also formed likewise.

Also, these circuit elements can be aligned not only in the longitudinal direction but also in the lateral direction so that the composite integrated circuit component is more downsized and the circuit elements are mounted to the high-density degree.

Furthermore, as the method of manufacturing the laminated body, the example using the printing method was described. The laminated body can be also manufactured by sputtering, evaporation or the like, and further can be manufactured by the combination of these methods. As the hydrogen introducing means formed on a lower portion of the laminated body, other means such as grooves or the like besides the holes can be used.

The dielectric material used as the material of the laminated body is not limited to barium titanate of this embodiment, but can be made of alumina, titanium oxide, etc. As the magnetic material constituting the inductor, Ni—Cu—Zn ferrite, galvanized ferrite, Mn—Zn ferrite, iron oxide ferrite, etc. can be used. Also, as the conductive material, in place of Ag—Pd powders, the combined material of Ag, Au, Cu, Pd or the alloy thereof can be used.

Further, in the embodiment, as the reflow film, the example using the PSG (phospho silicate) film was described. However, the present invention is not limited to this, but B—PSG (boro-phospho silicate) film, NSG—PSG (nondope silicate-phospho silicate) film, BSG (boro silicate) can be used for the reflow film.

In the above description, the reflow film is provided only around the thin film integrated circuit. However, it may be disposed on the entire surface of the substrate 100 of FIGS. 8 and 9(D), so that the holes for electrode connection may be formed by etching.

In this embodiment, the provision of the reflow film reduces the stress which tends to occur between the thin film integrated circuit and the laminated body when firing the laminated body at a high temperature. As a result, the reliability and production yield of the thin film integrated circuit in the composite integrated circuit component can be improved.

Furthermore, by providing the hydrogen introducing holes in the first material layer of the laminated body, the characteristics of the thin film integrated circuit portion such as TFT are stabilized thereby yet improving in yield.

Still further, after the thin film integrated circuit portion and the laminated body portion are formed on the large-sized substrate for multiple chips, the substrate is cut into the respective chip sizes before firing of the laminated body, and annealing of the hydrogenation treatment. As a result, cutting into chips can be facilitated, the stress due to firing can be reduced, and diffusion of hydrogen can be readily performed.

A third embodiment of the present invention will be described with reference to FIGS. 3, 10(A), 10(B), 11, and 12(A) to 12(F).

Figure 10A:
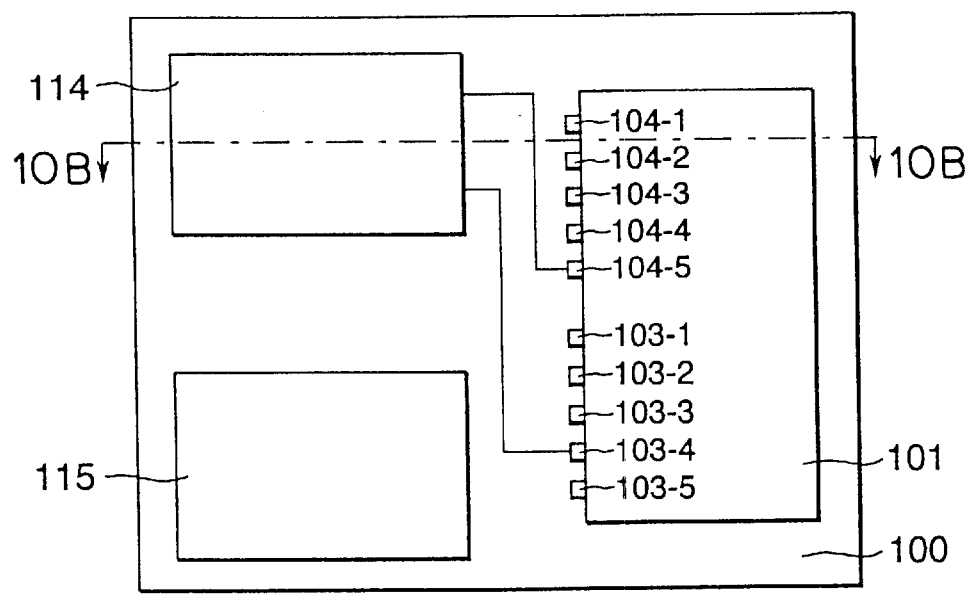
FIG. 10(A) is a schematic explanatory diagram showing a hybrid integrated circuit component in accordance with a third embodiment of the invention.
Figure 10B:
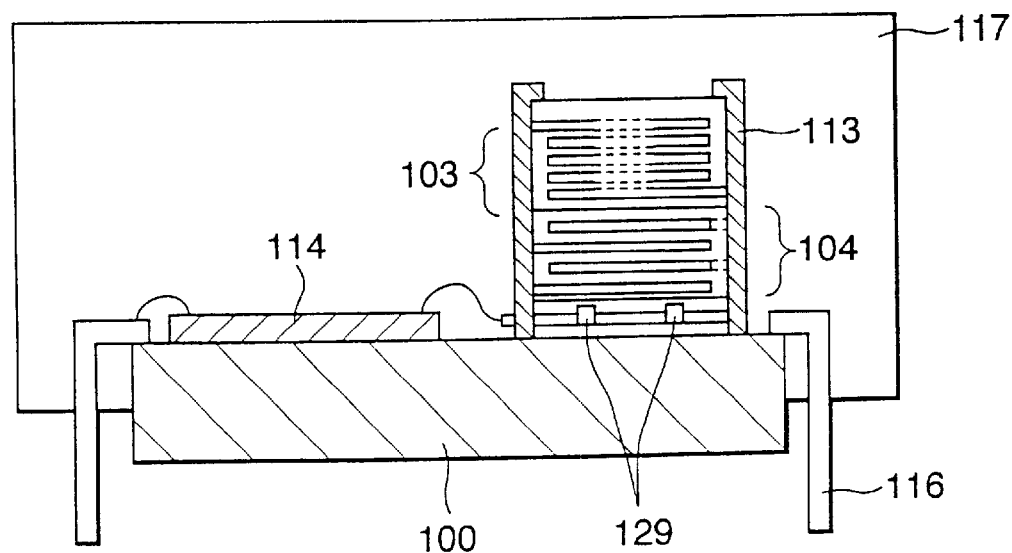
FIG. 10(B) is a cross-sectional view showing the hybrid integrated circuit component shown in FIG. 10(A)
Figure 11:
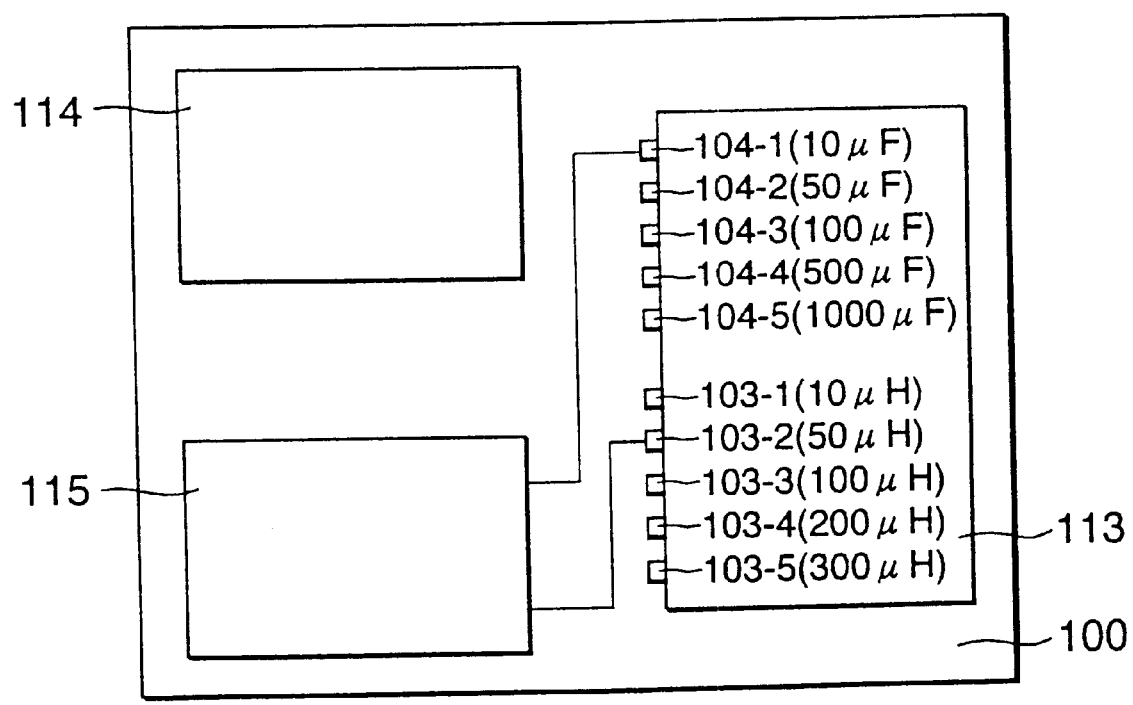
FIG. 11 is a schematic explanatory diagram showing a hybrid integrated circuit component in accordance with another example of the third embodiment of the invention.

FIGS. 10(A), 10(B) and 11 show schematic explanatory diagrams showing hybrid integrated circuit components in accordance with the present invention, in which FIG. 10(A) is a plan explanatory diagram and FIG. 10(B) is a cross-sectional structurally explanatory diagram taken along the line A–A' of FIG. 10(A).

In FIGS. 10(A) and 10(B), reference numeral 100 denotes a substrate; 113, a laminated passive circuit; 114 and 115, respective thin film integrated circuits; 116, an output terminal; 117, a resin; 104, a laminated capacitor; 103, a laminated inductor; and 129, resistors.

The thin film integrated circuit 114 is designed, for example, so as to function as a drive circuit of a DC-to-DC convertor and formed on a polycrystalline silicon substrate, and the thin film integrated circuit 115 is designed so as to function as a magnetic head drive circuit and formed on a polycrystalline silicon substrate.

In the laminated body 113, there are provided at the side of the laminated capacitor 104, for example, terminals 104-1 to 104-5 for 10 $\mu$F, 50 $\mu$F, 100 $\mu$F, 500 $\mu$F, and 1000 $\mu$F, and at the side of the laminated inductors 103, there are provided, for example, terminals 103-1 to 103-5 for 10 $\mu$H, 50 $\mu$H, 100 $\mu$H, 200 $\mu$H and 300 $\mu$H.

In the present invention, when the hybrid integrated circuit component is to be used as a DC-to-DC convertor for example, the terminals of the thin film integrated circuit 114 are connected to the terminal 104-5 having C=1000 $\mu$F and the terminal 103-4 with L=200 $\mu$H of the laminated body 113 as shown in FIG. 10(A).

Also, when the hybrid integrated circuit component is used, for example, as a magnetic head drive circuit, as shown in FIG. 11, the terminals of the thin film integrated circuit 115 are connected to the terminals 104-1 with C=10 $\mu$F and the terminal 103-2 with L=50 $\mu$H, respectively.

FIG. 3 is a schematic structural diagram showing a thin film transistor which constitutes a part of the thin film integrated circuit used in the present invention.

In FIG. 3, reference numeral 301 denotes a polycrystalline silicon substrate; 302, a silicon oxide film; 303, an active silicon layer; 304, a gate insulating film; 305, a gate electrode; 306 and 309, source and drain regions; 307, a phospho silicate film (PSG film); and 308, an aluminum wiring layer.

Through the same processes as those described with reference to FIGS. 4(A) to 4(F), 5(A) and 5(B), the thin film integrated circuit having TFT and an Al wiring are formed on a polycrystalline substrate.

Further, thus formed thin film integrated circuits 114 and 115 and the laminated body 113 are arranged, for example, as shown in FIG. 10(A). Any one of Cr, Ni, CrNiAu, Ti and Cu is deposited and patterned on electrical connecting portions (terminals) between these thin film integrated circuits 114 and 115 and the laminated body 113 to thereby perform the connection between the thin film integrated circuits and the laminated body.

Then, as the passivation film, at least one of an $SiO_2$ film, an $Si_3N_4$ film, a PSG film, etc. is formed by a CVD method, and only electrically connecting portions of the film thus formed with the laminated body are etched so as to be opened and then bump-soldered. Finally, the output terminal 116 is provided and the integrated circuit is molded with a resin 117 to complete the hybrid integrated circuit component.

The connection between the thin film integrated circuit 114, 115 and the laminated body 113 is not limited to the above description, but, may be performed by wire bonding shown in FIG. 10(B).

Further, in the above-mentioned embodiment, one composite laminated body consisting of at least one of the laminated inductor, the laminated capacitor and resistors and a plurality of thin film integrated circuits are mounted in parallel on the same substrate so that they are selectively connected to each other. However, this arrangement may be reversed.

Figure 12:
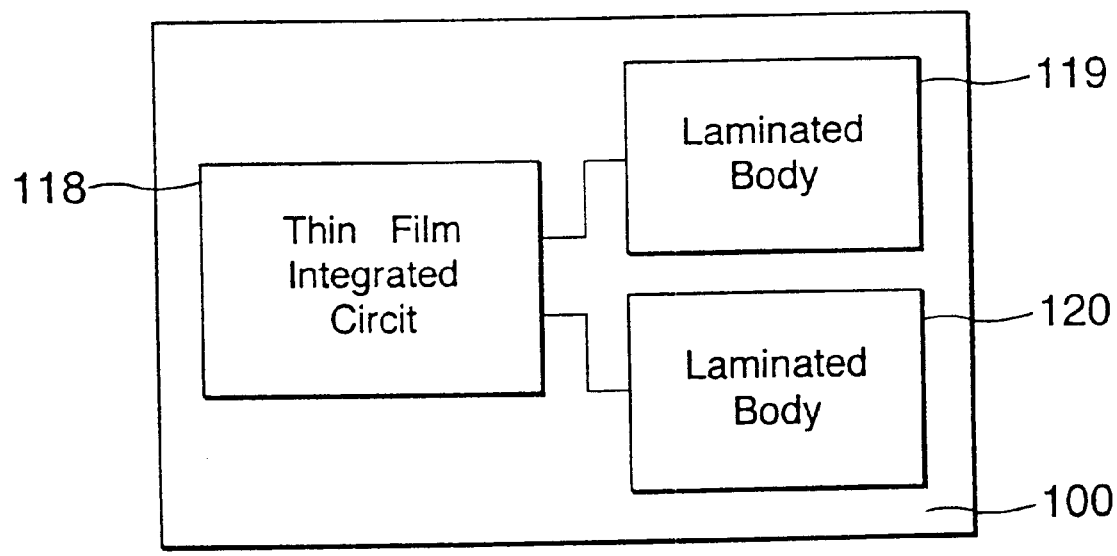
FIG. 12 is a schematic explanatory diagram showing another example of the hybrid integrated circuit component in accordance with the third embodiment of the invention.

That is, as shown in FIG. 12, a thin film integrated circuit 118, a plurality of laminated bodies 119 and 120 are arranged on a substrate 100. The laminated bodies 119 and 120 thus arranged have respective passive element portions with different sizes. Then, depending upon its use, the thin film integrated circuit 118 is selectively connected to any one of the laminated bodies 119 and 120.

In order to provide a variety of functions in the above-mentioned thin film integrated circuit, it is preferable to set the mobility characteristic of the active layer to 100 $cm^2$/v·sec or more. For this reason, the TFT is preferably formed within the non-single crystalline silicon substrate.

In the above-mentioned description, the example in which the laminated body is mounted on the substrate was described, however, the laminated body may be mounted on the thin film integrated circuit depending on its size.

Further, when a plurality of laminate bodies are mounted on the substrate, these laminated bodies are not limited to the same ones, but the laminated bodies with different values of LCR or the like may be mounted on the substrate.

In accordance with the present invention, a plurality of thin film integrated circuit chips having different functions, respectively and a laminated body consisting of a laminated passive element are mounted on one substrate, and one laminated body is commonly used as the passive element of the plurality of thin film integrated circuits, whereby the laminated body is effectively utilized, and the hybrid thin film integrated circuit component is low in costs and downsized.

Because the size of the laminated body is determined by the package area of the thin film integrated circuits, mounting of the laminated body does not require the enlarged package.

Further, since the thin film integrated circuits does not select the ground (substrate) a plurality of thin film integrated circuits can be formed on the same substrate by the same process, and therefore can be downsized in comparison with a case where one laminated body is selectively connected to individual different thin film integrated circuits, respectively.

A fourth embodiment of the present invention will be described with reference to FIGS. 13 and 14.

Figure 13:
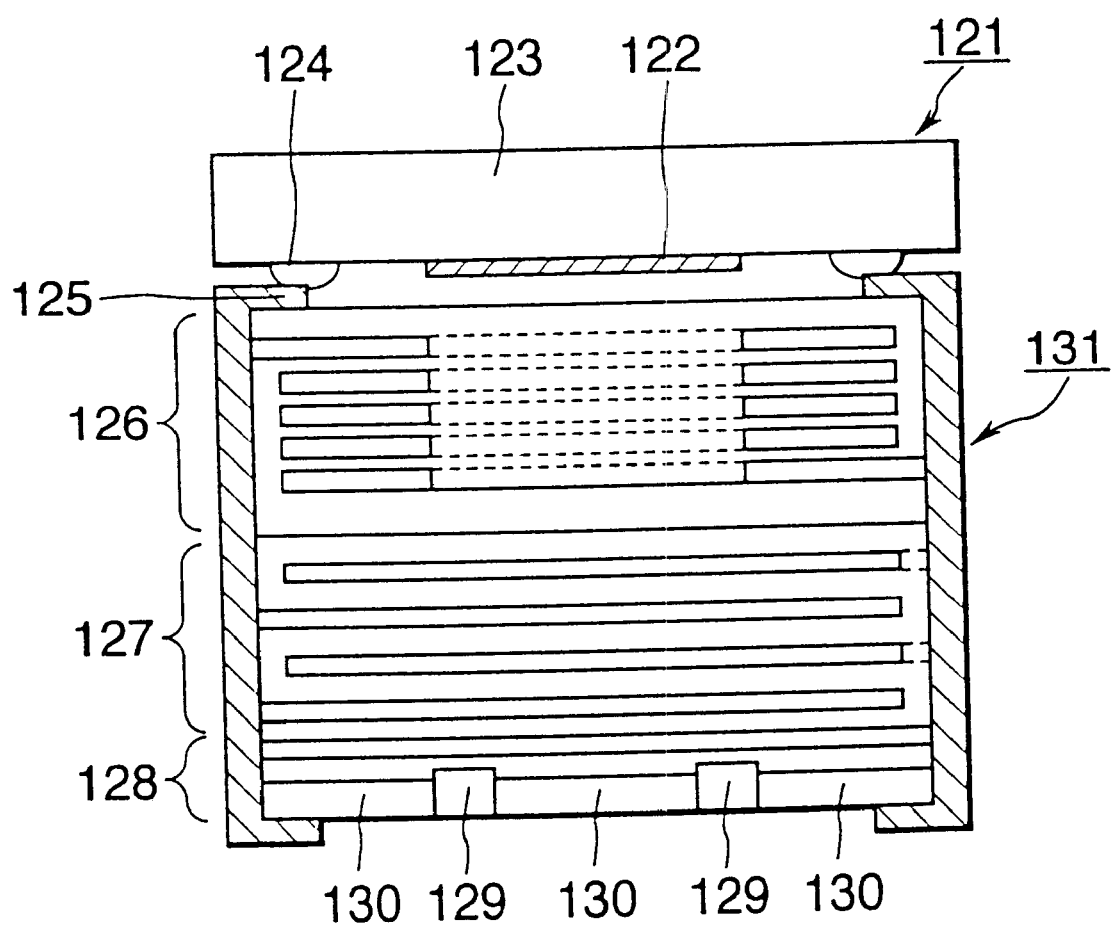
FIG. 13 is a cross-sectional view showing an outline of a hybrid integrated circuit component in accordance with a fourth embodiment of the invention.

FIG. 13 is a schematic structural diagram showing a hybrid integrated circuit component in accordance with a fourth embodiment of the present invention. In FIG. 13, reference numeral 121 denotes a thin film integrated circuit chip; 122, an active silicon film having a thin film integrated circuit formed therein; 123, a polycrystalline silicon substrate which is generally available for manufacturing solar cells; 124, pat portions; 125, output terminals; 126, a laminated inductor; 127, a laminated capacitor; 128, a resistor circuit; 129, a resistor body; 130, a conductor; and 131, a laminated body.

As a substrate of the thin film integrated circuit chip, if there is used a polycrystalline silicon substrate or a monocrystalline silicon substrate for a solar battery, both of which are available at a low price, the thin film integrated circuit chip can be reduced in costs.

In FIG. 13, the hybrid integrated circuit component is constituted by the thin film integrated circuit chip 121 and the laminated body 131. The laminated body 131 is constituted by a laminar structure comprising the lamination-type inductor 126, lamination-type capacitor 127 and the resistance circuit 128 having a resistance 129 and a conductor 130. The output terminal connects the laminated body 131 with the thin film integrated circuit chip 121 through the pat electrode 124 which is a solder-bump.

Figure 14:
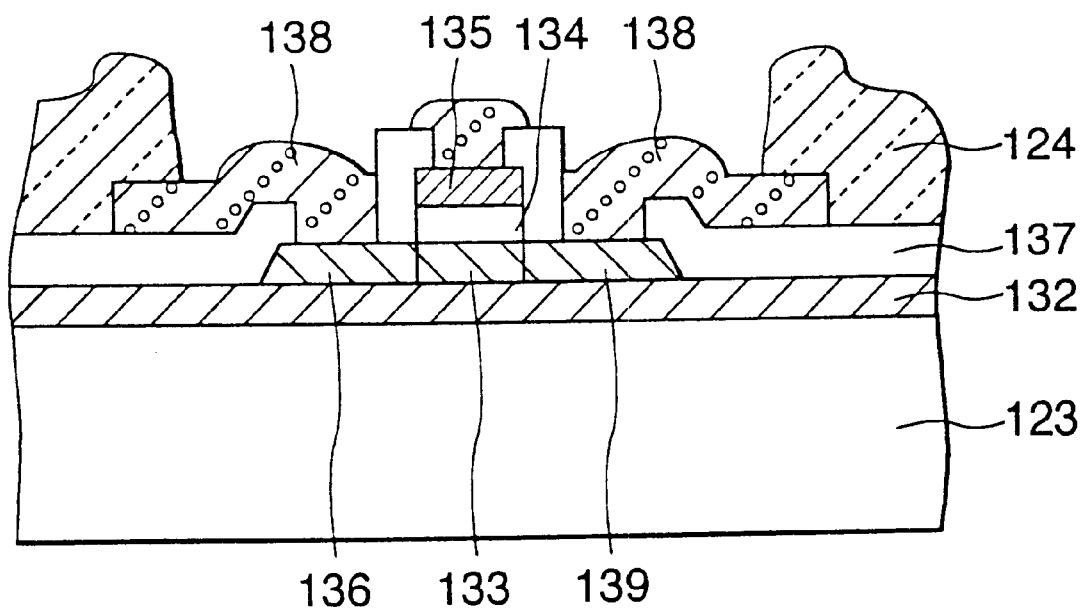
FIG. 14 is a cross-sectional view showing an outline of a thin film transistor used in the fourth embodiment of the invention.

FIG. 14 is a schematic structural diagram showing the TFT which constitutes the structural element of the thin film integrated circuit chip used in this embodiment.

In FIG. 14, reference numeral 123 denotes a polycrystalline silicon substrate for a solar battery; 124, pat electrodes made of solder bump; 132, a silicon oxide film; 133, an active silicon film; 134, a gate insulating film; 135, a gate electrode; 136 and 139, source and drain regions; and 138, aluminum wiring layers.

Figure 4:
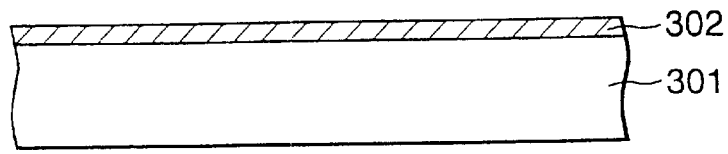
FIGS. 4(A) to 4(F) show steps of manufacturing a thin film transistor applied to the present invention.
Figure 4:
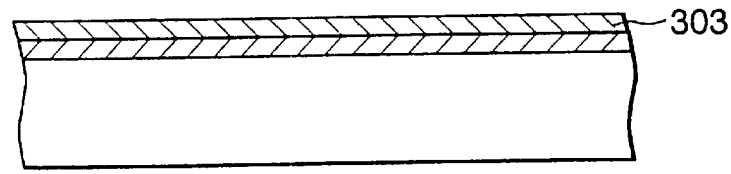
Figure 4:
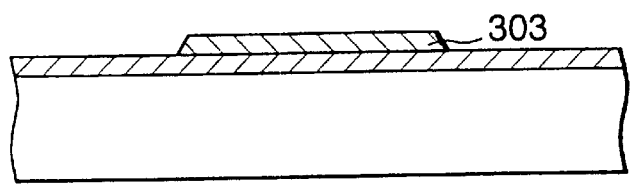
Figure 4:
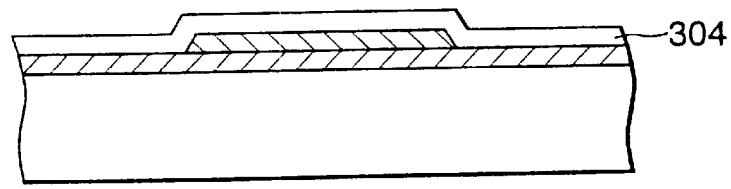
Figure 4:
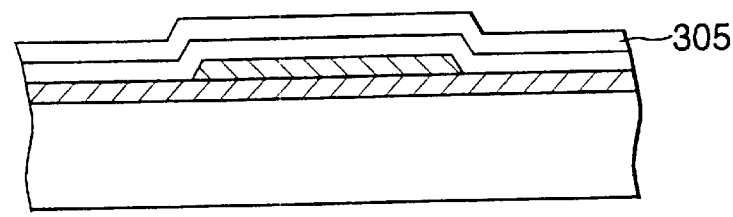
Figure 4:
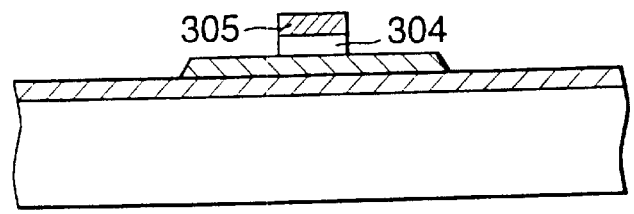
Figure 5:
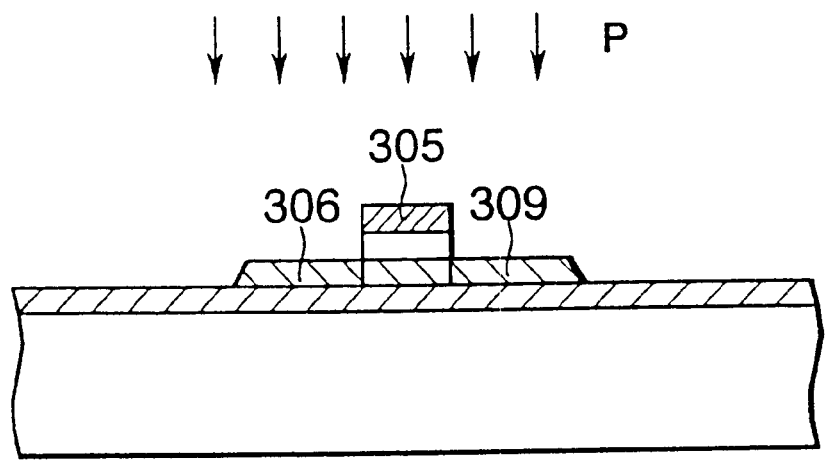
FIGS. 5(A) and 5(B) show steps of manufacturing the thin film transistor applied to the present invention.
Figure 5:
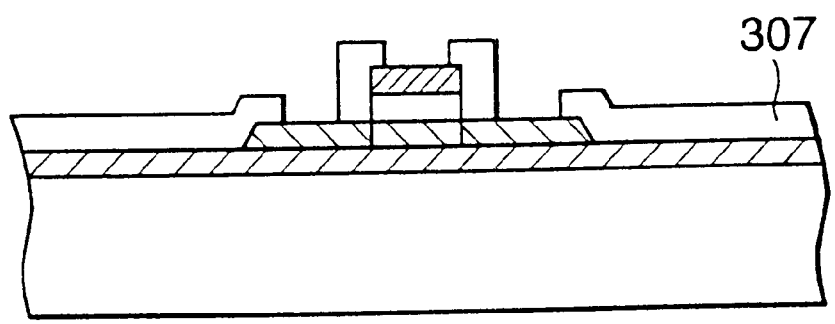

A process of manufacturing the thin film transistor is identical with those of the first and second embodiments described with reference to FIGS. 4 and 5, and therefore the duplicate description will be omitted.

As the substrate material on which TFT is formed, the polycrystalline silicon substrate 123 for the solar battery is used. The polycrystalline silicon substrate 123 for the solar battery is widely sold and formed of a substrate of the p-type having a resistivity of 0.5 to 3 $\Omega$cm. The substrate 123 is different from the ordinary silicon wafer used in the semiconductor process, a surface of which has been mirror-ground, and is not mirror-ground so as to provide a cutting-state surface. That is the surface has a condition in which the substrate is sliced from a semiconductor ingot and any surface treatment such as mirror-grinding is not performed thereon. Therefore, the substrate 123 can be clearly distinguished from the ordinary silicon wafer with the mirror-ground surface.

After the source and drain regions are activated through the process as in the first and second embodiments, they are further heated at 400° C. for one hour in a hydrogen atmosphere, and is then subjected to hydrogenation treatment, thereby making the defect level density of the active silicon film reduced.

Subsequently, after a PSG film 137 having a thickness of 4000 to 8000 Å is formed on the entire substrate by the atmospheric pressure CVD method, the film 137 is subjected to patterning for electrode wiring (refer to FIG. 14). Then, after formation of an aluminum film thereon, the aluminum film is subjected to patterning in accordance with a wiring pattern to thereby form the aluminum wiring layer 138.

Further, the pat portions 124 are formed for connection with the laminated body 131. This is achieved by forming a film of Cr, Ni, Au, Cr—Ni, Cr—Ni—Cu, or the like through a vapor deposition or sputtering method. Thus, the TFT as shown in FIG. 14 can be obtained.

The thin film integrated circuit including the TFT thus formed is formed on the substrate 123 in accordance with a circuit design to produce the thin film integrate circuit chip 121, and the laminated body 131 consisting of the passive circuit formed by the known method is electrically connected at the terminals 125 through the solder bumps to thereby obtain the hybrid integrated circuit component as shown in FIG. 13.

In the above description, the silicon substrate used in the example is polycrystalline, however, a single crystalline semiconductor substrate may be used.

The reason why the silicon substrate for the solar battery is used in the present invention is stated below.

First, because the silicon substrates for the solar battery are mass-produced and are available at a very low price in comparison with the silicon wafers used in the semiconductor process such as monolithic IC, which have been mirror-ground, the thin film integrated circuit chip 121 can be lowered in costs.

Further, the monocrystalline silicon substrate for the solar battery has a large number of defects, and therefore it is entirely improper to form transistors, etc. in such a substrate. However, if this is used as a substrate, and as was described in the above-mentioned embodiment, the active silicon film is formed through the silicon oxide film or the like to perform the semiconductor process, then an active element having a very high mobility characteristic such as TFT, etc., as shown in FIG. 15 can be obtained.

Figure 15:
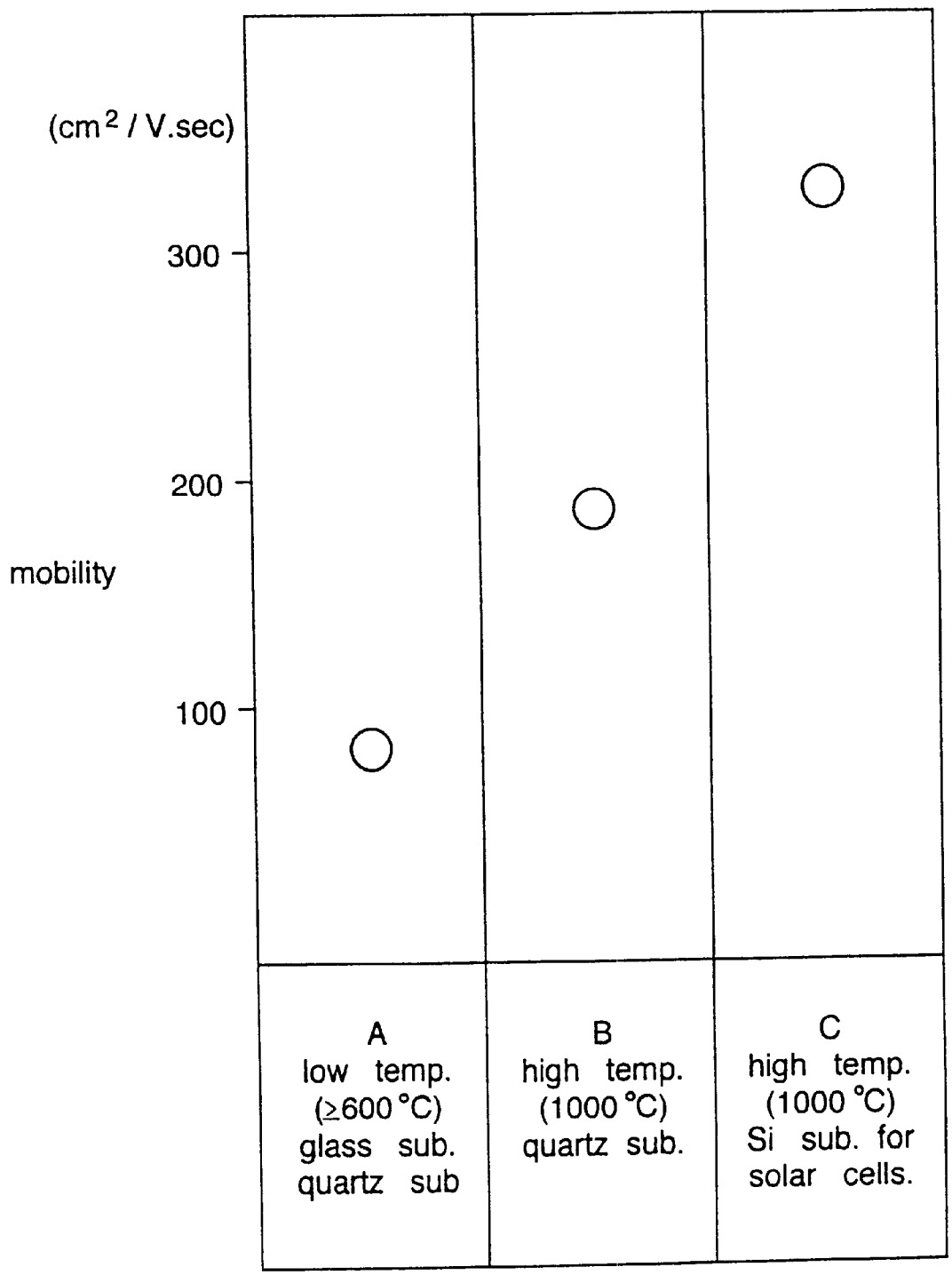
FIG. 15 is a diagram showing the relationships of a substrate forming a thin film transistor thereon, a process temperature and mobility.

FIG. 15 shows the mobility characteristic of TFTs depending upon the differences of the substrates and the process temperatures.

In FIG. 15, reference mark A represents the mobility in a case where TFT is formed with an active silicon film using a glass or a quartz as a substrate at a low temperature process of 600° C. or less. Reference mark B represents the mobility in a case where TFT is formed with an active silicon film on a quartz substrate at a high temperature process of approximately 1000° C. Reference mark C represents the mobility in a case where TFT is formed with an active silicon film on a polycrystalline or monocrystalline silicon substrate for the solar battery at a high temperature process of approximately 1000 ° C. in accordance with the present invention. The respective mobilities are indicated by round marks.

As is apparent from FIG. 15, in comparison with the case using the conventional quartz substrate or glass, the present invention uses the silicon for the solar battery as the substrate, and the high-temperature process is applied as the semiconductor process, thereby being capable of forming an element with a very high mobility characteristic of 300 $cm^2/v \cdot sec$.

The hybrid integrated circuit component of the present invention can be applied to a field of a high frequency, whereby the application of the circuit using the TFT is remarkably expanded.

The silicon substrate for the solar battery used as a substrate, that is, both of the polycrystalline silicon substrate and the monocrystalline silicon substrate are mass-produced and available at a low price. For that reason, the thin film integrated circuit.

Further, the thin film integrated circuit and the laminated body are connected to each other through solder bump to thereby further improve the mass-production as well as the reliability of the components.

A fifth embodiment of the present invention will be described with reference to FIG. 16.

Figure 16:
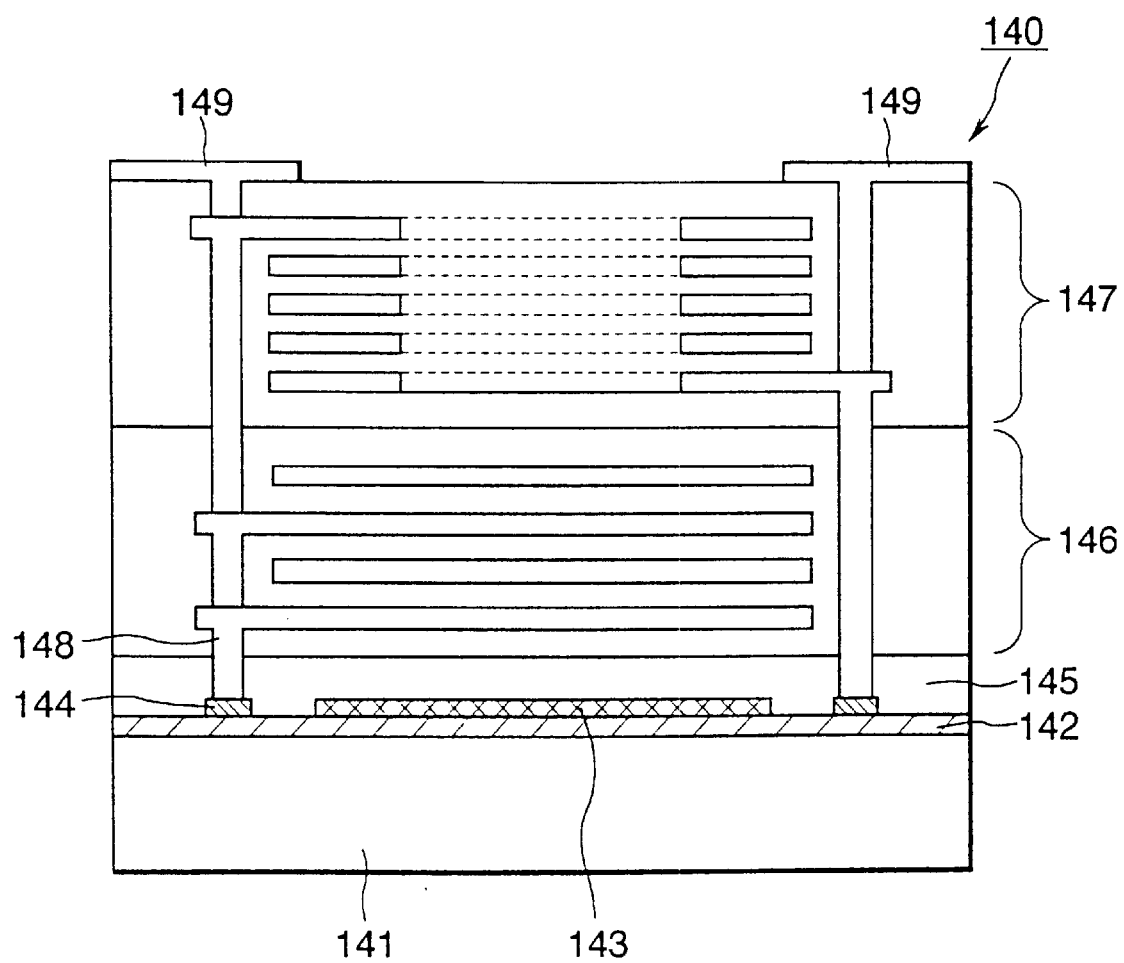
FIG. 16 is a cross-sectional view showing an outline of a composite integrated circuit in accordance with a fifth embodiment of the invention.

In FIG. 16, reference numeral 140 denotes a hybrid integrated circuit component; 141, a ceramic substrate; 142, a phospho silicate (PSG) film; 143, a thin film integrated circuit having a thin film transistor (TFT) or the like; 144, pat electrodes; 145, an inter-layer insulating film; 146, a laminated capacitor; 147, a laminated inductor; 148, electrodes; and 149, output electrodes.

In the hybrid integrated circuit component shown in FIG. 16, the surface of the ceramic substrate 141 is coated with, for example, the PSG film 142 mainly containing $SiO_2$ of heat resistance. The PSG film 142 has a thickness sufficient to allow the rough surface of the ceramic substrate 141 to be smoothed. The PSG film 142 can withstand the semiconductor process which will be performed at a temperature of 850° C. or more.

The laminated body consisting of the laminated capacitor 146 and the laminated inductor 147 is formed through the inter-layer insulating film 145 on the ceramic substrate 141 with the surface smoothed by the PSG film 142 on which the thin film integrated circuit such as TFT, etc. has been formed as in the foregoing embodiment. The ceramic substrate 141 is made of alumina.

The layer 142 mainly containing silicon oxide is formed by the following step.

First, the surface of the ceramic substrate 141 made of alumina is spin-coated with triethoxyline $P(OC_2H_5)_3$ and tetraethoxysilane $Si(OC_2H_5)_4$, and then annealed at 950° C. for 5 hours in the oxygen atmosphere. As a result, there is obtained a reflow film formed of a PSG film having a thickness of 5 $\mu$m as the layer 142 mainly containing silicon oxide.

The reason why the glass mainly containing $SiO_2$ is used as a film for smoothing the rough surface of the ceramic substrate as in the embodiment is to provide heat resistance for sufficiently withstanding the semiconductor process for formation of TFT which will be performed at 850° C. later and to provide no large difference in coefficient of thermal expansion between the PSG film and TFT.

Further, it is desirable to set the thickness of the PSG film 142 to 10 $\mu$m or less, so that the PSG film does not retain heat, to thereby obtain an inexpensive substrate having excellent heat release.

The manufacture of the thin film integrated circuit is made in the same manner as that in the foregoing embodiments 1 to 4, and therefore description of such manufacture is omitted. However, since the surface of the ceramic substrate 141 is smoothed by the layer 142 mainly consisting of silicon oxide, the active silicon layer also has a smoothed surface thereof. Also, a channel length L of TFT formed thereon can be controlled to 10 $\mu$m or less. Therefore, since an element with an improved frequency characteristic can be obtained, the applied field of the circuit can be widened when designing the integrated circuit.

The inter-layer insulating film 145, which also serves as a protective film, is formed in such manner that the PSG is spin-coated by a chip-on method, and thereafter through holes for electrode are formed in the coated PSG.

Alternatively, the inter-layer insulating film 145 can be obtained by forming silicon alkoxide and phosphorus alkoxide to an appropriate thickness before firing. The inter-layer insulating film 145 can be also formed by other methods, for example, a CVD method.

In constructing the thin film integrated circuit, in the case where a further distinct wiring is required, the inter-layer insulating film and the doped silicon film are stacked on each other to form a multi-layer wiring.

Subsequently, the laminated body constituting the passive element is provided on the substrate 141, on which the thin film integrated circuit is formed, by the printing method as in the first embodiment.

After removal of the organic binder in the laminated body and firing of the inductor and the capacitor are performed at 800 to 1000° C., for example, 850° C., the entire substrate including the laminated body is heat-treated at 400° C. for one hour in a hydrogen atmosphere to perform a hydrogenation process so as to reduce the defect level density contained in the active silicon film 143 formed on the ceramic substrate 141. Thus, the composite thin film integrated circuit component of this embodiment is completed.

In the above-mentioned embodiment, as one example, the method of forming the layer 142, which mainly contains silicon oxide, formed of the PSG film as the reflow film directly on the ceramic substrate 141 forming the thin film integrated circuit thereon was described. In the present invention, a high-melting-point metal or its silicide which is excellent in the heat conductivity can be formed between the ceramic substrate and the reflow film (not shown).

As the high-melting-point metal excellent in heat conductivity, there can be used molybdenum Mo, tungsten W, tantalum Ta, zirconium Zr, cobalt Co, hafnium Hf, etc. Their silicide can be also used.

For example, an Mo film is formed on the ceramic substrate such as alumina, etc. by the sputtering method.

The film forming conditions at this time are stated below.

Argon pressure: 0.5 to 10 mTorr

Reaction temperature: 300 to 500° C.

Power: 1 KW

Thereafter, the PSG film is spin-coated on the substrate on which the Mo film is formed, to thereby form the reflow film. The process which will be subsequently made is identical with that in the foregoing embodiments.

Thereafter, even though the heat treating process such as the semiconductor process, etc. is made, heat of the substrate is sufficiently released so as not to adversely affect the element characteristic.

Further, in the above-mentioned embodiment, there was described the example in which the laminated inductor is formed as the laminated body mounted on the substrate on which the thin film integrated circuit is formed. However, the present invention is not limited to or by this, but can employ other passive circuit elements, for example, a resistor, a laminated capacitor or the combination thereof.

In addition, the method of forming these laminated body is not limited only to or by the printing method described in the above-mentioned embodiment, but can be performed by the sputtering method, the deposition method, etc, or the combination thereof.

The conductive material for forming the laminated body may be made of silver Ag, gold Au, copper Cu, paradium Pd or the alloy thereof. The magnetic material may be made of, besides the above-mentioned materials, galvanized ferrite, Mn—Zn ferrite, iron oxide ferrite, etc. The dielectric material may be made of alumina, barium titanate, titanium oxide, etc.

In the above-mentioned embodiment, there was described the example in which the laminated body is formed on the substrate having the reflow film thereon on which the thin film integrated circuit has been already formed. However, the present invention can be applied to a case where the laminated body which has been formed by different process is mounted onto the above-mentioned substrate.

Further, in the above-mentioned embodiment, there was described the example in which the semiconductor process is performed by a high-temperature process of 800° C. or more. However, even in the case of a low-temperature process, provision of the reflow film enables the thin film integrated circuit excellent in the characteristic to be obtained.

In the above-mentioned embodiment, there was described the case where the PSG film is used for the layer 142 mainly containing silicon oxide. However,BSG (boro silicate), B—PSG (boro-phospho silicate), NSG—PSG (nondope silicate-phospho silicate), etc can also be used.

Similarly, the inter-layer insulating film 145 is not limited to the PSG, but may be made of BSG, B—PSG, NSG—PSG, etc.

With the structure of the present invention, the laminated body formed of the passive element and the ceramic substrate on which the thin film integrated circuit having desired characteristics has been formed can be integrated with each other, resulting in the possibility of making the composite thin film integrated circuit component downsized, concentrated to the high degree, and lowered in costs.

Furthermore, according to the present invention, the thin film integrated circuit can be formed on the inexpensive ceramic substrate. In particular, since the semiconductor process of a relatively high temperature can be made by using the ceramic substrate, the integrated circuit element with a widely applied circuit can be formed.

A sixth embodiment of the present invention will be described with reference to FIGS. 17 and 18.

Figure 17:
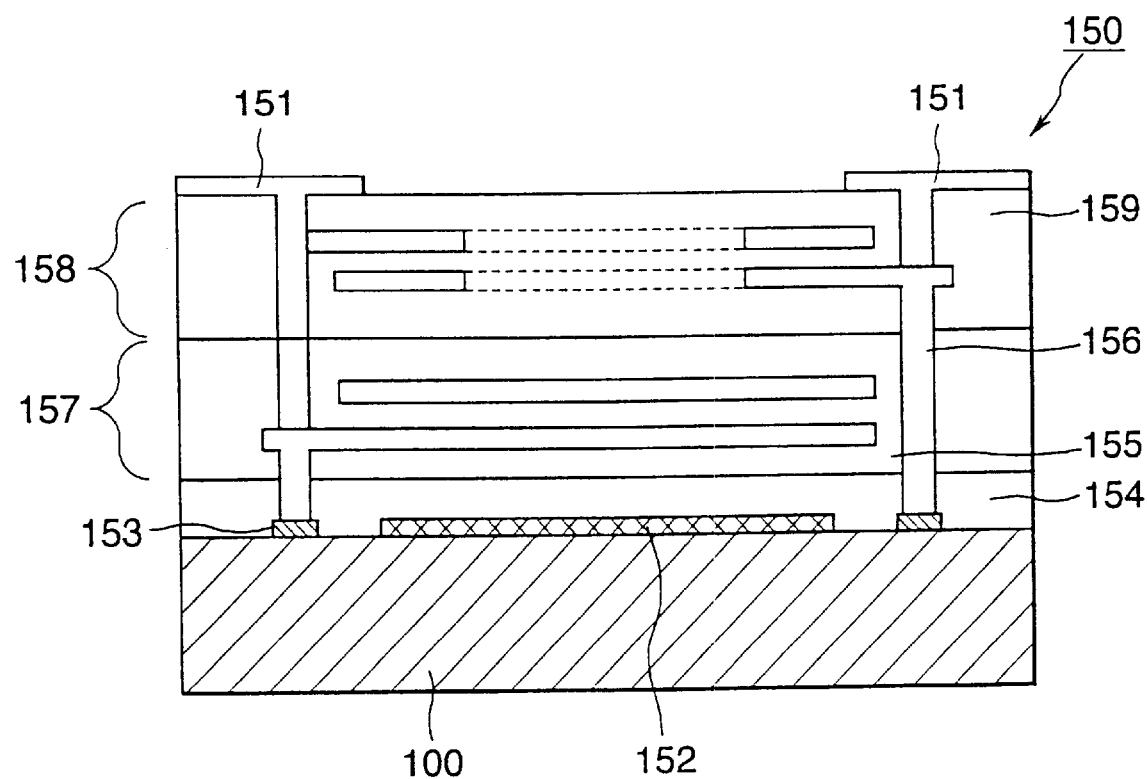
FIG. 17 is a cross-sectional view showing an outline of a composite integrated circuit in accordance with a sixth embodiment of the invention.
Figure 18:
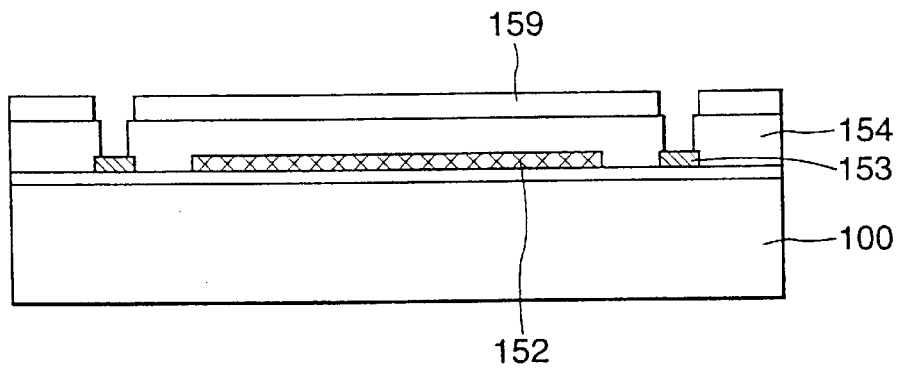
FIGS. 18(A) to 18(C) show steps of manufacturing a laminated inductor used in the composite integrated circuit in accordance with the sixth embodiment of the invention, respectively.
Figure 18:
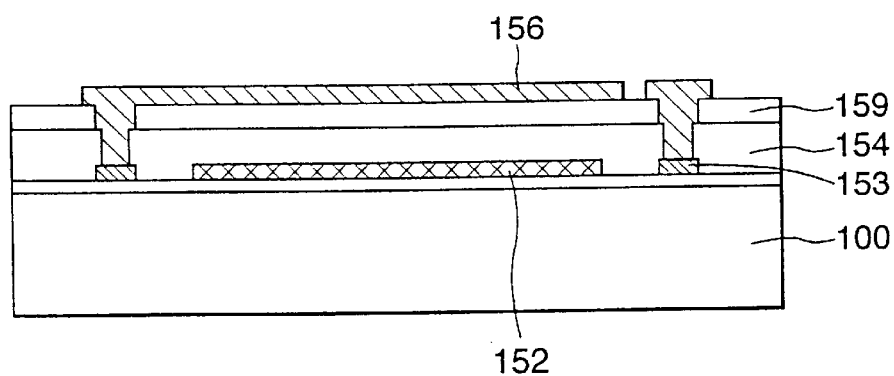
Figure 18:
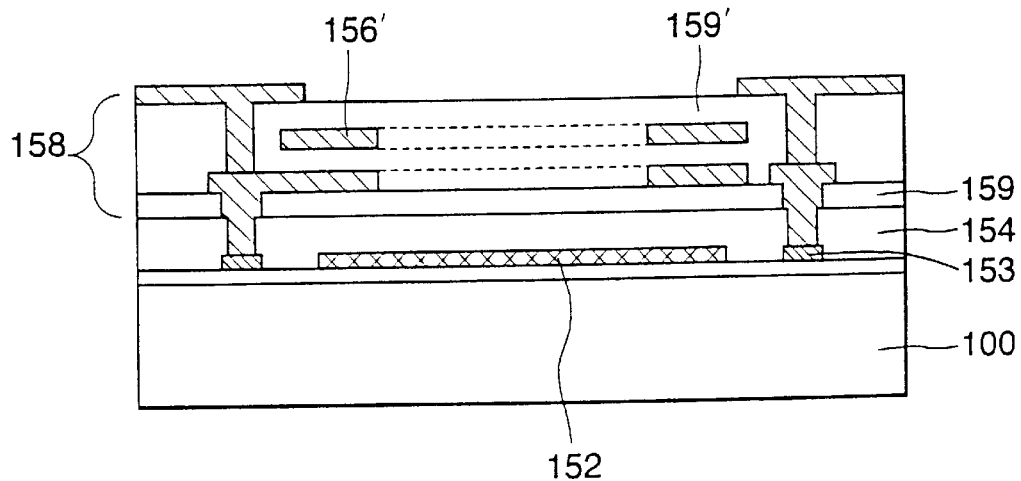

FIG. 17 is a schematic explanatory diagram showing a thin film composite integrated circuit component 150 in accordance with the sixth embodiment of the present invention.

In FIG. 17, reference numeral 100 denotes a substrate; 152, a thin film integrated circuit chip; 153, output electrodes; 154, a phospho silicate (PSG) film; 155, a TiO$_2$ layer; 156, an Al layer; 157, a thin film laminated capacitor; 158, a thin film laminated inductor; 159, a thin film magnetic material layer; and 151, output electrodes.

In the embodiment, the PSG film 154 is formed on the substrate 100 having the thin film integrated circuit chip 152 thereon through an atmospheric pressure CVD. On the PSG film 154, the thin film laminated capacitor 157 is formed by laminating a dielectric layer such as a TiO$_2$ layer 155 and an aluminum layer 156 in turn through a mask deposition or mask sputtering method. Further, the thin film laminated inductor 158 comprising a magnetic layer 159 and an aluminum layer 156 is stacked on the capacitor.

The inter-layer film 154 may be made of other materials other than PSG, for example,a nondope silicate (NSG) film, a boro-silicate (BSG) film, and a film mainly containing SiO$_2$ such as a boro-phospho silicate (B PSG) film which is a mixture of boro-silicate (BSG) and phospho silicate (PSG). The thickness of the film is 0.1 to 5 μm, preferably 8000 Å or more. These glass films can be formed by the atmosphere pressure CVD method.

The thin film integrated circuit chip 152, the thin film laminated capacitor 157 and the thin film laminated inductor 158 are electrically connected to one another through the output electrodes 153 of the thin film integrated circuit and the Al layer 156 which constitutes the conductive material layer.

The formation of the thin film integrated circuit chip 152 may be made by any one of the processes described in accordance with the foregoing embodiments. The substrate is formed of the inexpensive polycrystalline substrate or ceramic substrate, and the thin film integrated circuit including the TFT is then prepared on the substrate by the foregoing process.

In the present invention, subsequently, on the substrate 100 on which the thin film integrated circuit chip 152 has been prepared, as shown in FIG. 17, a passive element in the form of film such as a thin film laminated capacitor 157 a thin film laminated inductor 158, etc. are formed through the PSG film 154 by the thin film process.

A case where the laminated inductor 158 is formed as the thin film laminated portion will be described with reference to FIG. 18.

As the magnetic material, there is used Ni—Cu—Zn ferrite, and mask-sputtering is carried out under the following conditions, thereby forming the Ni—Cu—Zn ferrite film 159 (refer to FIG. 18(A)).

The sputtering conditions are stated below.

Target: Ni—Cu—Zn

Argon pressure: 10 to 100 mTorr

Reaction temperature: 150° C.

RF power: 1 KW

Through-holes are formed in the ferrite film 159 in correspondence with the output electrodes 153 of the thin film integrated circuit chip 152. (FIG. 18(A))

Subsequently, as the conductive material layer of the inductor, Al is deposited by the mask-sputtering to form the Al layer 156, and also the output electrodes 153 of the thin film integrated circuit and the conductive layers 156 are connected to each other (refer to FIG. 18(B)).

Likewise, using the thin film process, another Ni—Cu—Zn ferrite film 159' and another conductive layer 156' are formed so as to provide the laminated thin film inductor 158 (refer to FIG. 18(C)).

Thereafter, as occasion demands, the laminated thin film capacitor may be formed on the thin film inductor 158.

For example, the film forming conditions in the case of performing mask-sputtering using TiO$_2$ as the dielectric material are stated below.

Degree of vacuum: 0.01 Torr

Substrate temperature: 200° C.

Source temperature: 1500° C.

After the TiO$_2$ film is formed under these conditions, Al is subjected to mask-sputtering, so that it is laminated as the conductive film, thereby forming, for example, the thin film integrated capacitor 157 as shown in FIG. 17.

In the present invention, because the respective passive elements are formed by the thin film process such as the mask-sputtering, etc. as the laminated portion formed on the substrate on which the thin film integrated circuit is formed, it is sufficient to only change the reaction condition so that the manufacturing is facilitated. In the case of producing multiple layers, heating process is made at the time of the sputtering process. Therefore, in order to reduce the influence, the number of laminated layers is preferably 10 or less in total.

With the structure of the present invention, since the laminated portion formed on the substrate on which the thin film integrated circuit chip has been formed is entirely performed by thin film processes, there is no need of performing a high-temperature heat treatment for the substrate, such as the firing process due to a high temperature as in the conventional thick film forming method.

As a result, there is no adverse influence caused by the difference in coefficient of heat expansion between the contracted laminated body and the substrate on which the thin film integrated circuit is formed due to firing.

Further, since there is no high-temperature treatment after formation of the thin film integrated circuit, hydrogenation is facilitated and the element characteristics are not adversely affected by heating.

Still further, the laminated portion made by the thin film forming method is thinner than that made by the conventional thick film forming method, thereby making the component downsized and compact-sized. Since the size of an IC chip is determined in accordance with the size of resin mold, the resin mold is integrated as the whole and therefore downsized.

Still further, as the conductive material of the laminated portion, inexpensive Al can be used in place of expensive Pd, and in view of this, the thin film integrated circuit component is lowered in costs.

It will be apparent to those skilled in the art that various modifications may be made within the spirit of the invention and the scope of the appended claims.

What is claimed is:

1. A composite integrated circuit component comprising:
   a substrate;
   a thin film type integrated circuit element formed on said substrate, said thin film type integrated circuit element comprising at least one thin film transistor comprising a silicon semiconductor; and
   a laminate type passive circuit element formed on and operatively connected to said integrated circuit,
   wherein said thin film transistor has a channel region comprising a polycrystalline silicon semiconductor doped with hydrogen, and said passive circuit comprises a magnetic material or a dielectric material selected from a ferrite, alumina, barium titanate and titanium oxide.

2. The integrated circuit component of claim 1 wherein said passive circuit element comprises at least one of a laminate type capacitor and a laminate type inductor.

3. The integrated circuit component of claim 1 wherein said thin film type integrated circuit element includes a wiring comprising a doped silicon.

4. The component of claim 1 wherein said substrate comprises a material selected from the group consisting of quartz, sapphire, silicon and alumina.

5. The composite integrated circuit component according to claim 1 wherein said ferrite is selected from the group consisting of galvanized ferrite, Mn—Zn ferrite, Ni—Cu—Zn ferrite, and iron oxide ferrite.

6. A composite integrated circuit component comprising:
   a substrate;
   a thin film type integrated circuit element formed on said substrate, said thin film type integrated circuit element comprising at least one thin film transistor comprising a silicon semiconductor; and
   a laminate type passive circuit element including at least one of a laminate type capacitor and a laminate type inductor,
   wherein an outer package of said component is formed by said substrate and a dielectric material or magnetic material forming said laminate type passive element,
   wherein said thin film transistor has a channel region comprising a polycrystalline silicon semiconductor doped with hydrogen.

7. A composite integrated circuit component comprising:
   a substrate;
   a thin film type integrated circuit element formed on said substrate, said thin film type integrated circuit element comprising at least one thin film transistor comprising a silicon semiconductor; and
   a laminate type passive circuit element provided over said integrated circuit
   wherein a reflow layer is interposed between said thin film type integrated circuit element and said laminate type passive circuit element,
   wherein said thin film transistor has a channel region comprising a polycrystalline silicon semiconductor doped with hydrogen, and said passive circuit comprises a magnetic material or a dielectric material selected from a ferrite, alumina, barium titanate and titanium oxide.

8. The component of claim 7 wherein said reflow layer comprises a material selected from the group consisting of phospho silicate glass, boro-phospho silicate glass, non-doped silicate glass-phospho silicate glass and boro silicate glass.

9. The integrated circuit component of claim 7 wherein said passive circuit element comprises at least one of a laminate type capacitor and a laminate type inductor.

10. The integrated circuit component of claim 7 further comprising a hydrogen introducing means between said integrated circuit element and said passive circuit element.

11. The component of claim 10 wherein said means is a perforation formed in a dielectric layer formed between said integrated circuit element and said passive circuit element.

12. The component of claim 11 further comprising a reflow layer interposed between said integrated circuit element and said perforation.

13. The composite integrated circuit component according to claim 7 wherein said ferrite is selected from the group consisting of galvanized ferrite, Mn—Zn ferrite, Ni—Cu—Zn ferrite, and iron oxide ferrite.

14. A composite integrated circuit component comprising:
   a substrate;
   a plurality of thin film type integrated circuit elements formed on said substrate, each of said thin film type integrated circuit element comprising at least one thin film transistor comprising a silicon semiconductor; and
   a laminate type passive circuit element formed on said substrate,
   wherein said passive circuit element is selectively connected to one of said integrated circuit elements, wherein said thin film transistor has a channel region comprising a polycrystalline silicon semiconductor doped with hydrogen, and said passive circuit comprises a magnetic material or a dielectric material selected from a ferrite, alumina, barium titanate and titanium oxide.

15. The integrated circuit component of claim 14 wherein said passive circuit element comprises at least one of a laminate type capacitor, a resistance and a laminate type inductor.

16. The composite integrated circuit component according to claim 14 wherein said ferrite is selected from the group consisting of galvanized ferrite, Mn—Zn ferrite, Ni—Cu—Zn ferrite, and iron oxide ferrite.

17. A composite integrated circuit component comprising:

a substrate;

a thin film type integrated circuit element formed on said substrate, said thin film type integrated circuit element comprising at least one thin film transistor comprising a silicon semiconductor; and a plurality of laminate type passive circuit elements formed on said substrate;

wherein said thin film type integrated circuit element is selectively connected to at least one of said plurality of laminate type passive circuit elements, wherein said thin film transistor has a channel region comprising a polycrystalline silicon semiconductor doped with hydrogen, and said passive circuit comprises a magnetic material or a dielectric material selected from a ferrite, alumina, barium titanate and titanium oxide.

18. The integrated circuit component of claim 17 wherein said passive circuit elements comprise at least one of a laminate type capacitor, a resistance and a laminate type inductor.

19. The composite integrated circuit component according to claim 17 wherein said ferrite is selected from the group consisting of galvanized ferrite, Mn—Zn ferrite, Ni—Cu—Zn ferrite, and iron oxide ferrite.

20. A hybrid integrated circuit member comprising:

a semiconductor substrate;

a passivation layer formed on said semiconductor substrate;

a thin film type integrated circuit element formed on said passivation layer, said thin film type integrated circuit element comprising at least one thin film transistor comprising a silicon semiconductor; and a laminate type passive circuit element provided over said integrated circuit, wherein said semiconductor substrate has a surface which is not treated with a mirror grinding treatment, wherein said thin film transistor has a channel region comprising a polycrystalline silicon semiconductor doped with hydrogen.

21. A hybrid integrated circuit element comprising:

a semiconductor substrate having a surface;

a passivation layer formed on the surface of said semiconductor substrate;

a thin film type integrated circuit element formed on said passivation layer, said thin film type integrated circuit element comprising at least one thin film transistor comprising a silicon semiconductor; and a laminate type passive circuit element provided over said integrated circuit, wherein said surface is a as-slice surface from a semiconductor ingot, wherein said thin film transistor has a channel region comprising a polycrystalline silicon semiconductor doped with hydrogen.

22. The integrated circuit element of claim 20 or 21 wherein said thin film type integrated circuit element and said laminate type passive circuit element are connected with each other through solder bumps.

23. A composite integrated circuit element comprising:

a ceramic substrate;

a thin film type integrated circuit element formed on said ceramic substrate;

a passive type circuit element comprising a laminated body formed on said integrated circuit element, wherein a planarizing layer is interposed between said ceramic substrate and said thin film type integrated circuit element to provide a planarized surface for the integrated circuit, and said passive circuit comprises a magnetic material or a dielectric material selected from a ferrite, alumina, barium titanate and titanium oxide.

24. The integrated circuit element of claim 23 wherein said planarizing layer comprises glass selected from the consisting of phospho-silicate glass, boro-silicate glass, boro-phospho-silicate glass, and nondoped-silicate glass-phosphosilicate glass.

25. The integrated circuit element of claim 23 wherein a layer comprising a refractive metal or a silicide thereof is further provided between said planarizing layer and said ceramic substrate.

26. The integrated circuit element of claim 25 wherein said refractive metal is selected from the group consisting of molybdenum, tungsten, tantalum, zirconium, cobalt and hafnium.

27. The integrated circuit element of claim 23 wherein said integrated circuit element includes a thin film transistor having a channel length not longer than 10 $\mu$m.

28. The composite integrated circuit component according to claim 23 wherein said ferrite is selected from the group consisting of galvanized ferrite, Mn—Zn ferrite, Ni—Cu—Zn ferrite, and iron oxide ferrite.

* * * * *

UNITED STATES PATENT AND TRADEMARK OFFICE
CERTIFICATE OF CORRECTION

PATENT NO. : 6,410,960 B1
DATED : June 25, 2002
INVENTOR(S) : Michio Arai et al.

It is certified that error appears in the above-identified patent and that said Letters Patent is hereby corrected as shown below:

<u>Title page,</u>
Item [73], Assignee, insert -- TDK Corporation --

Signed and Sealed this

Nineteenth Day of August, 2003

JAMES E. ROGAN
*Director of the United States Patent and Trademark Office*